US012800679B2

(12) United States Patent
Vosburgh

(10) Patent No.: US 12,800,679 B2
(45) **Date of Patent: *Nov. 17, 2026**

(54) SELF-LOCATING COMPASS

(71) Applicant: Archaius Inc., Durham, NC (US)

(72) Inventor: Frederick Vosburgh, Durham, NC (US)

(73) Assignee: Archaius Inc., Durham, NC (US)

( * ) Notice: Subject to any disclaimer, the term of this patent is extended or adjusted under 35 U.S.C. 154(b) by 322 days.

This patent is subject to a terminal disclaimer.

(21) Appl. No.: 18/625,821

(22) Filed: Apr. 3, 2024

(65) Prior Publication Data

US 2024/0248152 A1 Jul. 25, 2024

Related U.S. Application Data

(63) Continuation of application No. 18/208,051, filed on Jun. 9, 2023, now Pat. No. 11,965,940, which is a continuation of application No. 18/111,718, filed on Feb. 20, 2023, now Pat. No. 11,675,026, which is a continuation-in-part of application No. 17/958,949, filed on Oct. 3, 2022, now Pat. No. 11,624,611.

(60) Provisional application No. 63/312,261, filed on Feb. 21, 2022.

(51) Int. Cl.

*G01C 17/28* (2006.01)
*G01R 33/00* (2006.01)
*G01R 33/02* (2006.01)

(52) U.S. Cl.

CPC ......... *G01R 33/0213* (2013.01); *G01C 17/28* (2013.01); *G01R 33/0023* (2013.01)

(58) Field of Classification Search

CPC ............................ G01C 17/28; G01C 21/1654
USPC ........................................... 33/354, 356, 361
See application file for complete search history.

(56) References Cited

U.S. PATENT DOCUMENTS

| | | | | |
|---|---|---|---|---|
| 5,511,319 | A | 4/1996 | Geerlings et al. | |
| 5,564,194 | A * | 10/1996 | Fujita | G01R 33/09 33/355 R |
| 5,739,431 | A | 4/1998 | Petri | |
| 6,968,273 | B2 | 11/2005 | Ockerse et al. | |
| 7,194,816 | B2 | 3/2007 | Tamura | |
| 7,340,362 | B2 * | 3/2008 | Kitamura | G01C 17/28 701/530 |
| 7,635,930 | B2 | 12/2009 | Ohishi | |
| 8,108,171 | B2 | 1/2012 | Judd | |
| 8,275,544 | B1 | 9/2012 | Wells et al. | |
| 8,311,767 | B1 | 11/2012 | Stetson | |
| 8,402,666 | B1 | 3/2013 | Hsu et al. | |
| 8,407,905 | B1 | 4/2013 | Hsu et al. | |
| 8,560,259 | B2 | 10/2013 | Stephanson | |
| 9,243,915 | B2 | 1/2016 | Hernandez et al. | |

(Continued)

*Primary Examiner* — George B Bennett
(74) *Attorney, Agent, or Firm* — Neo IP

(57) ABSTRACT

Systems, methods, and apparatuses for a self-locating compass for use in navigation are disclosed. The self-locating compass is operable to provide position and/or velocity without information from a global positioning system (GPS) device. The self-locating compass includes a direction finder and a Lorentz force detector. The method includes determining orientation with respect to Earth's magnetic field, measuring a Lorentz force proportional to rate of change of location with respect to the field, determining a change in location, and updating location.

20 Claims, 19 Drawing Sheets
(3 of 19 Drawing Sheet(s) Filed in Color)

(56) References Cited

U.S. PATENT DOCUMENTS

| | | | | |
|---|---|---|---|---|
| 9,303,991 | B2 | 4/2016 | Garrone | |
| 9,387,927 | B2 | 7/2016 | Rischmuller et al. | |
| 9,588,190 | B2 | 3/2017 | Smith et al. | |
| 9,664,750 | B2 * | 5/2017 | Thompson | G01R 33/0286 |
| 9,927,237 | B2 | 3/2018 | Kimishima | |
| 10,123,472 | B1 | 11/2018 | Schneider | |
| 10,132,932 | B1 | 11/2018 | McConville et al. | |
| 10,222,396 | B2 | 3/2019 | Evangelista et al. | |
| 10,514,774 | B1 | 12/2019 | Keal | |
| 10,601,355 | B2 | 3/2020 | Vasudevan et al. | |
| 10,794,698 | B2 | 10/2020 | Sun et al. | |
| 10,852,364 | B2 | 12/2020 | Kushleyev et al. | |
| 11,231,746 | B2 | 1/2022 | Chen | |
| 11,422,166 | B2 * | 8/2022 | Kobayashi | G01R 15/205 |
| 11,624,611 | B1 | 4/2023 | Vosburgh | |
| 11,675,026 | B1 | 6/2023 | Vosburgh | |
| 11,965,940 | B2 * | 4/2024 | Vosburgh | G01R 33/0094 |
| 2005/0016006 | A1 * | 1/2005 | Sasagawa | G01C 17/28<br>33/355 R |
| 2007/0067128 | A1 | 3/2007 | Vock et al. | |
| 2013/0096825 | A1 * | 4/2013 | Mohanty | G01C 21/1654<br>701/472 |
| 2016/0349052 | A1 | 12/2016 | Deutschmann et al. | |
| 2017/0048439 | A1 | 2/2017 | Borcke-Morawitz et al. | |
| 2021/0167487 | A1 | 6/2021 | Varma et al. | |
| 2021/0396542 | A1 | 12/2021 | Toutov et al. | |
| 2023/0341480 | A1 | 10/2023 | Vosburgh | |

* cited by examiner

SELF-LOCATING COMPASS

CROSS REFERENCES TO RELATED APPLICATIONS

This application is related to and claims priority from the following U.S. patents and patent applications. This application is a continuation of U.S. patent application Ser. No. 18/208,051, filed Jun. 9, 2023, which is a continuation of U.S. patent application Ser. No. 18/111,718, filed Feb. 20, 2023, which is a continuation-in-part of U.S. patent application Ser. No. 17/958,949, filed Oct. 3, 2022. U.S. patent application Ser. No. 18/111,718 also claims priority to and the benefit of U.S. Provisional Patent Application No. 63/312,261, filed Feb. 21, 2022. Each of the above-listed applications is incorporated herein by reference in its entirety.

BACKGROUND OF THE INVENTION

1. Field of the Invention

The present invention relates to navigation, and more specifically to a self-locating compass (SLC) using the Earth's magnetic field lines as a frame of reference for measuring velocity and determining geographic location.

2. Description of the Prior Art

It is generally known in the prior art to provide location sensors and navigation tools.

Prior art patent documents include the following:

U.S. Patent Publication No. 20070067128 for Location determining system by inventors Vock, et al., filed Nov. 17, 2006 and published Mar. 22, 2007, is directed to a location measurement system including a GPS receiver for attachment to a person and for determining earth location of the person; a display for attachment to the person; memory for storing map data; a processor configured to process earth location and the map data to instruct display the person's current location with a map on the display.

U.S. Pat. No. 9,243,915 for Devices and methods for passive navigation by inventors Vosburgh, et al., filed Oct. 16, 2014 and issued Jan. 26, 2016, is directed to devices and methods for determining position and controlling navigation by sensing movement through the Earth's magnetic field. Change in position is determined by integrating velocity which has been normalized for spatial and temporal field variation. Position is registered with respect to starting point and/or subsequently detected environmental feature. Signals are provided to actuator for guidance, navigation and control.

U.S. Patent Publication No. 20170048439 for Gimbal Mount for a Sensor by inventors Borcke-Morawitz, et al., filed Apr. 24, 2015 and published Feb. 16, 2017, is directed to a gimbal mount for a sensor having an outer and inner gimbal mount to stabilize vibrations in a wide frequency band without having to statically balance the sensor. A direct drive is provided for at least one drive of an outer axis of rotation of the outer gimbal mount and an amplified piezo actuator is provided for at least one drive of an inner axis of rotation of the inner gimbal mount. The at least one outer axis of rotation is provided for vibration stabilization in a first range of the frequency band to be stabilized and the at least one inner axis of rotation stabilization is provided for vibration stabilization in a second range in the frequency band to be stabilized. The outer gimbal mount and the inner gimbal mount are embodied as mechanically rigid constructions which transmit vibrations in the frequency band to be stabilized essentially without damping.

U.S. Pat. No. 8,311,767 for Magnetic navigation system by inventor Stetson, filed Jul. 13, 2009 and issued Nov. 13, 2012, is directed to a magnetic navigation system that senses the three-dimensional magnetic fields of the Earth and compares them with a model of the Earth's magnetic fields. An initial guess as to system location is corrected toward the actual location by accessing magnetic amplitude from library pages in response to corrected location. Error detectors determine amplitude error, which is processed with magnetic gradient information from gradient models to generate the new attitude and location correction values. The correction values are subtracted from the guess to generate the new updated location. The system iterates to continually tend toward the actual location.

U.S. Patent Publication No. 20210396542 for Operating Modes of Magnetic Navigation Devices by inventors Toutov, et al., filed Jun. 15, 2021 and published Dec. 23, 2021, is directed to a method including collecting, by a magnetic navigation device, magnetic measurements of a particular geographical region in accordance with a position and trajectory of the magnetic navigation device; accessing a global navigation satellite system (GNSS) signal status and a network connection status on the magnetic navigation device; determining an operational mode for the magnetic navigation device based on the GNSS signal status and the network connection status; determining whether to transmit the magnetic measurements to a server or store the magnetic measurements locally on the magnetic navigation device based on the operational mode; and performing navigation or localization operations using the operational mode.

U.S. Pat. No. 9,387,927 for Rotary-wing drone comprising autonomous means for determining a position in an absolute coordinate system linked to the ground by inventors Rischmuller, et al., filed Jul. 3, 2014 and issued Jul. 12, 2016, is directed to a drone including a vertical-view camera pointing downward to pick up images of a scene of the ground overflown by the drone; gyrometer, magnetometer and accelerometer sensors; and an altimeter. Navigation means determine position coordinates (X, Y, Z) of the drone in an absolute coordinate system linked to the ground. These means are autonomous, operating without reception of external signals. They include image analysis means, adapted to derive a position signal from an analysis of known predetermined patterns, present in the scene picked up by the camera, and they implement a predictive-filter estimator incorporating a representation of a dynamic model of the drone, with as an input the position signal, a horizontal speed signal, linear and rotational acceleration signals, and an altitude signal.

U.S. Pat. No. 8,275,544 for Magnetically stabilized forward observation platform by inventors Wells, et al., filed Jul. 31, 2009 and issued Sep. 25, 2012, is directed to a system and method for determining a position of a remote object comprising inertial sensors and three axis magnetic sensor, together with a target sighting device aligned with the observation platform to determine a target line of sight and a target range finder to determine a distance to the target along the line of sight. A GPS receiver may be included for determining an observation platform position and orientation, The three axis magnetic sensor provides both magnetic north and vertical attitude information for improved rapid initialization and operation in motion. Magnetic anomaly information is detected by comparing IMU and magnetic navigation information and by other methods. Target identification may be determined by a human operator and/or by computer. The system may be integrated with a weapon system to use weapon system sights. The system may be networked to provide target location and/or location error information to another identical unit or a command information system.

SUMMARY OF THE INVENTION

The present invention relates to location determination, and more specifically to a self-locating compass (SLC) using the Earth's magnetic field lines as a frame of reference for measuring velocity and thereby change in location.

It is an object of this invention to provide for location determination without the use of a Global Positioning System (GPS) device.

In one embodiment, the present invention provides a device for measuring velocity including at least one sensing unit, wherein the at least one sensing unit includes a first loop and a second loop, and a battery, wherein the battery is operable to provide a bias current, wherein the first loop includes a sensing element connected at a first end and a second end to the battery, wherein the sensing element is operable to carry the bias current, wherein the second loop is positioned across the sensing element at a midpoint, wherein the second loop includes a first conductor coupled between a first side of the sensing element and a measurement circuit, wherein the measurement circuit is further connected to a second conductor coupled to the second side of the sensing element, wherein the second loop is operable to determine a potential based on deflection of the bias current by a Lorentz drag force, and wherein a magnetic velocity is calculated based on the potential.

In another embodiment, the present invention provides a device for measuring velocity including at least one sensing unit, wherein the at least one sensing unit includes a first loop and a second loop, and a battery, wherein the battery is operable to provide a bias current, wherein the first loop includes a sensing element connected at a first end and a second end to the battery, wherein the sensing element is operable to carry the bias current, wherein the sensing element is formed from a material having a slow charge relaxation rate, wherein the second loop is positioned across the sensing element at a midpoint, wherein the second loop includes a first conductor coupled between a first side of the sensing element and a measurement circuit, wherein the measurement circuit is further connected to a second conductor coupled to the second side of the sensing element, wherein the first conductor and the second conductor are formed of a fast-relaxing material, wherein the second loop is operable to determine a potential based on deflection of the bias current by a Lorentz drag force, and wherein the potential is used to calculate a magnetic velocity.

In yet another embodiment, the present invention provides a method of determining velocity through a magnetic field including providing a bias current in a sensing element of at least one sensing unit using a battery, wherein the at least one sensing unit includes a first loop and a second loop, detecting and measuring deflection of the bias current by a Lorentz drag force, determining a potential based on the deflection, and calculating a magnetic velocity using the potential, wherein the first loop includes a sensing element connected at a first end and a second end to the battery, wherein the second loop is positioned across the sensing element at a midpoint, wherein the second loop includes a first conductor coupled between a first side of the sensing element and a measurement circuit, wherein the measurement circuit is further connected to a second conductor coupled to the second side of the sensing element.

These and other aspects of the present invention will become apparent to those skilled in the art after a reading of the following description of the preferred embodiment when considered with the drawings, as they support the claimed invention.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

DETAILED DESCRIPTION

Figure 1:
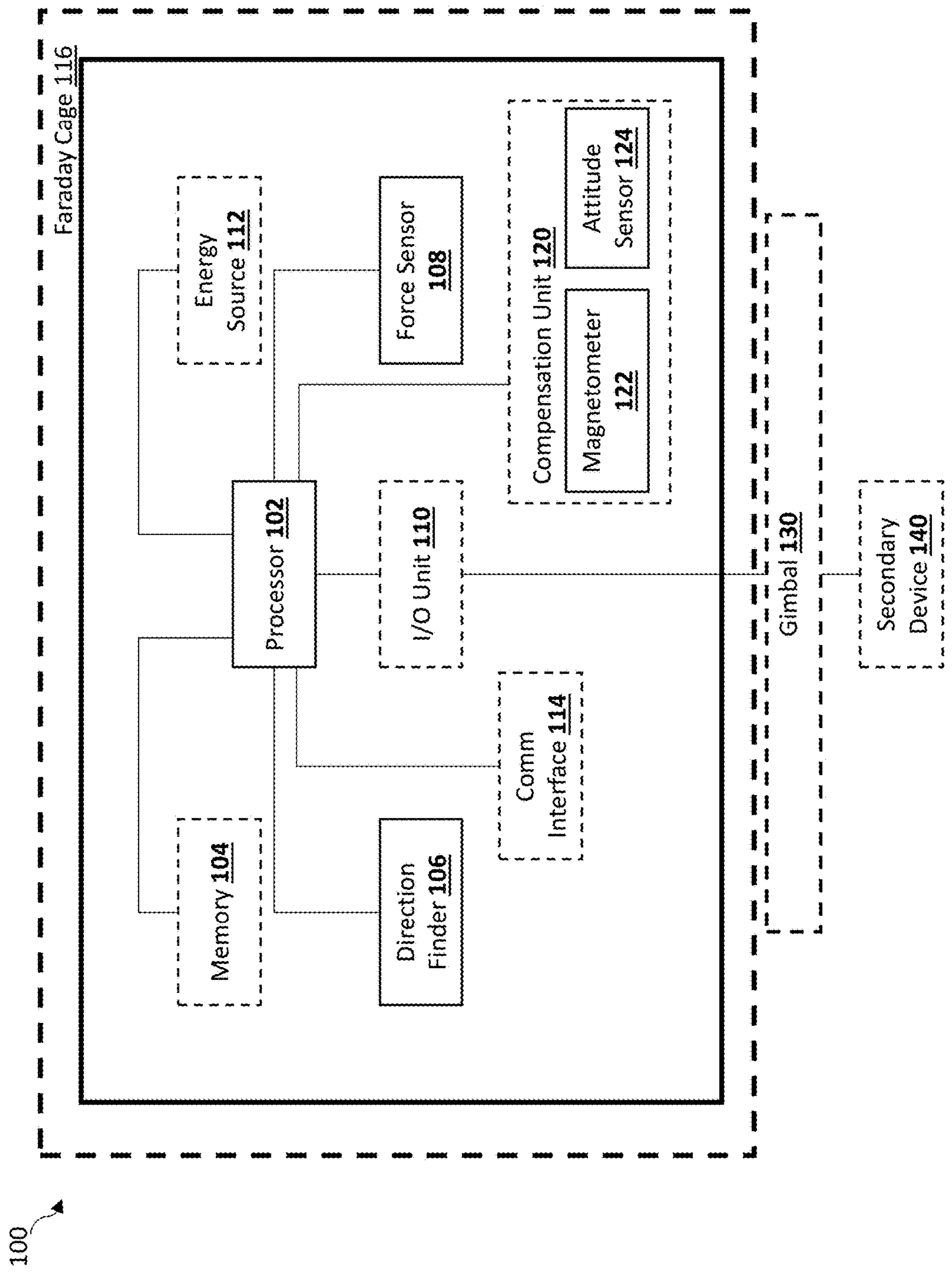
FIG. 1 illustrates one embodiment of a self-locating compass (SLC).

The present invention is generally directed to navigation, and more specifically to a self-locating compass (SLC) using the Earth's magnetic field lines as a frame of reference for measuring velocity and determining geographic location.

Since the Chinese invented the compass more than 2,000 years ago, it has served as a primary navigational aid, allowing people and vehicles to reach their destination, although the inability of such compasses to detect the effect of winds, currents, wheel slip, and other forces that can cause a vehicle to lose its way.

Other navigational aids have been proposed to determine location, with examples ranging from the astrolabe to the Global Positioning System (GPS) (U.S. Pat. No. 4,445,118). While GPS reception can support precise positioning, it is vulnerable to disruption in some areas, such as natural canyons, caves, and underwater, as well as in bad weather or indoors. Further, GPS is disrupted by interfering signals (e.g., jamming, spoofing), which pose a threat to national defense and the global economy.

In response to the vulnerability of GPS, a variety of navigation sensors have been proposed to backup or complement GPS-navigation, including radar (U.S. Pat. No. 2,085,059), electro-optical (U.S. Pat. No. 3,477,666), magnetic map following (U.S. Pat. No. 4,885,536), magnetic speed sensing (U.S. Pat. No. 8,311,767), and inertial systems (U.S. Pat. No. 3,104,545).

Of the various alternatives, inertial navigation sensors (INS) are the dominant products used for GPS backup. However, INS suffer fundamental limitations including, but not limited to, a fast-accumulating integration error that badly degrades location precision and the inability to detect cross winds and currents, which can rapidly degrade navigation accuracy by pushing a vehicle off course.

In light of the above, the present disclosure provides a self-locating compass (SLC) that is operable to determine location by measuring and processing the force of magnetic field drag during transit through the Earth's magnetic field. The present invention is operable to provide position and/or velocity without the use of GPS. For example, and not limitation, the present invention is operable to position and/or velocity due to intermittent loss of GPS, which can occur frequently (e.g., for an autonomous vehicle passing through a tunnel).

A self-locating compass (SLC) uses the Earth's magnetic field as a frame of reference, orienting with respect to the field lines and measuring velocity through the magnetic field by detecting a Lorentz drag force on a force sensor from the velocity that is quantified by methods disclosed herein. The SLC devices and methods are operable to be selected or adjusted depending on the intended use and level of performance. Advantageously, the SLC is operative at any velocity, including hypersonic, and in any magnetic field, including unknown magnetic fields. In contrast, existing magnetic navigation methods require prior data on field intensity used in triangulation or correlation methods of self-localization. In one embodiment, the SLC includes a processor connected to a direction finder and a force sensor. In some embodiments, the SLC includes a compensation unit operable to compensate for variations in field intensity and orientation with respect to the direction of gravity or the horizon. In one embodiment, the SLC is incorporated into a vehicle (e.g., plane, car, truck, drone, etc.) as described herein. The SLC is preferably operable to determine and/or control navigation through the Earth's magnetic field. Further, the SLC is immune to jamming and/or spoofing due to DC-field capability. Because the SLC is operable to determine position independent of GPS, the SLC is operable to quickly and reliably detect GPS jamming and/or spoofing.

An illustrative use of the SLC is to navigate from a first location (e.g., departure point) during transit along a magnetic bearing towards a second location (e.g., destination), determining change in position by integrating magnetic drag force or normalized drag force. In one embodiment, a current location is determined by adding a change in location to a prior location. In one embodiment, drag force is normalized for variation in field strength and adjusted with a force-velocity calibration to determine velocity through the field. In one embodiment, attitude signals are used to convert velocity through the field into velocity over ground and/or geolocation.

The magnetic field pervades the Earth, including its ground and bodies of water, as well as the atmosphere and space that surrounds the Earth. As such, the SLC is operable to be used to navigate underwater and underground, on the ground and the water's surface, and in the air and space above the ground or water, as well as inside a natural or manmade enclave, including, but not limited to, a building or a tunnel.

What is needed is a self-locating compass to determine location and/or velocity without use of GPS. There is a long-standing, unmet need for a self-locating compass that is accurate and precise. As described previously, the typical supplement or alternative to GPS is INS; however, INS suffers from a fast-accumulating integration error. Advantageously, the self-locating compass of the present invention does not suffer from this fast-accumulating integration error, and is, therefore, operable to provide a more accurate location than INS. Further, there is a long-standing, unmet need for magnetic navigation systems and methods that do not require prior data on magnetic field intensity used in triangulation or correlation methods of self-localization. Additionally, there is a long-standing, unmet need for accurate location data that is not susceptible to jamming and/or spoofing like GPS. None of the prior art describes a self-locating compass operable to provide accurate and precise location and/or velocity data that is further operable to determine and/or control navigation through the Earth's magnetic field.

In one embodiment, the present invention provides a self-locating compass including at least one processor, a direction finder operable to determine an orientation with respect to Earth's magnetic field lines, and a Lorentz force sensor including at least one sensing unit operable to detect a potential induced by coupling of the Earth's magnetic field with charges in the Lorentz force sensor, wherein the at least one sensing unit includes at least one measurement circuit and at least one sensing element, wherein the Lorentz force sensor is operable to measure the potential over a period of time, and wherein the at least one processor is operable to determine a velocity and/or a change in position. In one embodiment, the Lorentz force sensor is operable to detect a Lorentz force in at least two dimensions. In one embodiment, the direction finder is operable to determine the orientation in at least two dimensions. In one embodiment, the at least one sensing element comprises a plurality of sensing elements mounted in a non-parallel arrangement. In one embodiment, the Lorentz force sensor includes a dual loop sensing unit. In one embodiment, wherein the Lorentz force sensor includes at least one Faraday rod sensing element. In one embodiment, the self-locating compass further includes a magnetometer operable to determine magnetic field intensity. In one embodiment, the self-locating compass further includes an attitude sensor operable to quantify orientation with respect to gravity, a horizontal plane, and/or a vertical plane. In one embodiment, the self-locating compass further includes at least one memory connected to one or more of the at least one processor. In one embodiment, the self-locating compass further includes an input/output (I/O) unit, wherein the I/O unit is operable to receive input data and/or output navigation or navigation control signals. In one embodiment, the self-locating compass further includes a communications interface, wherein the communications interface is a wired and/or wireless communication interface for connecting to at least one network. In one embodiment, the direction finder is a compass. In one embodiment, the direction finder is operable to detect direction relative to a radiofrequency (RF) source and/or an electro-optical source. In one embodiment, the direction finder is a vector magnetometer operable to determine magnetic field intensity in at least two dimensions. In one embodiment, the Lorentz force sensor is operable to detect a Lorentz force in at least two dimensions. In one embodiment, the at least one measurement circuit and/or at least one sensing unit is surrounded by a Faraday cage. In one embodiment, the self-locating compass further includes at least one gimbal operable to orient the self-locating compass. In one embodiment, the self-locating compass has a drift rate of less than 80 meters per hour. In one embodiment, the self-locating compass further includes at least one inertial measurement unit (IMU) and/or at least one inertial navigation system (INS). In one embodiment, the at least one processor is operable to integrate the measured potential over the period of time, wherein the at least one processor is operable to normalize the integrated measured potential. In one embodiment, the Lorentz force sensor is operable to measure the potential a plurality of times over the period of time. In one embodiment, the at least one sensing unit is operable to detect the potential induced by coupling of the Earth's magnetic field with the charges in the at least one sensing element of the Lorentz force sensor.

In another embodiment, the present invention provides a self-locating compass including at least one processor, a direction finder operable to determine an orientation with respect to Earth's magnetic field lines, a Lorentz force sensor including at least one sensing unit operable to detect a potential induced by coupling of the Earth's magnetic field with charges in the Lorentz force sensor, and a magnetometer operable to determine magnetic field intensity, wherein the at least one sensing unit includes at least one measurement circuit and at least one sensing element, wherein the Lorentz force sensor is operable to measure the potential over a period of time, wherein the at least one processor is operable to integrate the measured potential over the period of time, and wherein the at least one processor is operable normalize the integrated measured potential to determine a velocity and/or a change in position. In one embodiment, the magnetometer is operable to determine the magnetic field intensity in at least two dimensions. In one embodiment, the Lorentz force sensor is operable to detect a Lorentz force in at least two dimensions. In one embodiment, the direction finder is operable to determine the orientation in at least two dimensions.

In yet another embodiment, the present invention provides a self-locating compass including at least one processor, a direction finder operable to determine an orientation with respect to Earth's magnetic field lines in at least two dimensions, a Lorentz force sensor including at least one sensing unit operable to detect a potential induced by coupling of the Earth's magnetic field with charges in the Lorentz force sensor, and at least one inertial measurement unit (IMU) and/or at least one inertial navigation system (INS), wherein the at least one sensing unit includes at least one measurement circuit and at least one sensing element, wherein the at least one measurement circuit is surrounded by a Faraday cage, wherein the at least one IMU and/or the at least one INS is operable to provide magnetometer and attitude signals, wherein the Lorentz force sensor is operable to measure the potential over a period of time, wherein the at least one processor is operable to integrate the measured potential over the period of time, and wherein the at least one processor is operable to normalize the integrated measured potential to determine a velocity and/or a change in position. In one embodiment, the magnetometer and attitude signals are operable to be fused with the velocity to reset errors of the at least one IMU and/or the at least one INS. In one embodiment, the magnetometer and attitude signals are non-integrated magnetometer and attitude signals, wherein the non-integrated magnetometer and attitude signals undergo Kalman filtering.

In one embodiment, the present invention provides a device for measuring velocity including at least one sensing unit, wherein the at least one sensing unit includes a first loop and a second loop, and a battery, wherein the battery is operable to provide a bias current, wherein the first loop includes a sensing element connected at a first end and a second end to the battery, wherein the sensing element is operable to carry the bias current, wherein the second loop is positioned across the sensing element at a midpoint, wherein the second loop includes a first conductor coupled between a first side of the sensing element and a measurement circuit, wherein the measurement circuit is further connected to a second conductor coupled to the second side of the sensing element, wherein the second loop is operable to determine a potential based on deflection of the bias current by a Lorentz drag force, and wherein a magnetic velocity is calculated based on the potential. In one embodiment, the measurement circuit includes an input connected to an amplifier, wherein the amplifier is further connected to an analog-to-digital (A/D) converter, wherein the A/D converter is further connected to the output of the measurement circuit. In one embodiment, the device further includes an analog filter connected between the amplifier and the A/D converter and/or a digital filter connected between the A/D converter and the output. In one embodiment, the second loop is of an optoelectronic type. In one embodiment, the sensing element is formed from a material having a slow charge relaxation rate. In one embodiment, the sensing element has a length to width ratio greater than 1:1. In one embodiment, the first conductor and the second conductor are formed of a fast-relaxing material. In one embodiment, the fast-relaxing material is copper. In one embodiment, the measurement circuit includes a temperature compensation unit. In one embodiment, the sensing element includes a source type connection to the battery and sink type connections at the first end and the second end. In one embodiment, the at least one sensing unit includes a plurality of sensing units, wherein at least two sensing units of the plurality of sensing units are in a non-parallel arrangement.

In another embodiment, the present invention provides a device for measuring velocity including at least one sensing unit, wherein the at least one sensing unit includes a first loop and a second loop, and a battery, wherein the battery is operable to provide a bias current, wherein the first loop includes a sensing element connected at a first end and a second end to the battery, wherein the sensing element is operable to carry the bias current, wherein the sensing element is formed from a material having a slow charge relaxation rate, wherein the second loop is positioned across the sensing element at a midpoint, wherein the second loop includes a first conductor coupled between a first side of the sensing element and a measurement circuit, wherein the measurement circuit is further connected to a second conductor coupled to the second side of the sensing element, wherein the first conductor and the second conductor are formed of a fast-relaxing material, wherein the second loop is operable to determine a potential based on deflection of the bias current by a Lorentz drag force, and wherein the potential is used to calculate a magnetic velocity.

In yet another embodiment, the present invention provides a method of determining velocity through a magnetic field including providing a bias current in a sensing element of at least one sensing unit using a battery, wherein the at least one sensing unit includes a first loop and a second loop, detecting and measuring deflection of the bias current by a Lorentz drag force, determining a potential based on the deflection, and calculating a magnetic velocity using the potential, wherein the first loop includes a sensing element connected at a first end and a second end to the battery, wherein the second loop is positioned across the sensing element at a midpoint, wherein the second loop includes a first conductor coupled between a first side of the sensing element and a measurement circuit, wherein the measurement circuit is further connected to a second conductor coupled to the second side of the sensing element. In one embodiment, the measuring of the deflection includes amplifying the potential to provide an amplified signal, converting the amplified signal to a digital signal, and providing the digital signal to a processor for processing to form the calculated magnetic velocity. In one embodiment, the method further includes adjusting the providing of the bias current and/or the amplifying of the potential. In one embodiment, the method further includes adjusting an orientation of the sensing element with respect to the magnetic field to alter coupling to the magnetic field. In one embodiment, the method further includes adjusting the bias current to provide desirable magnitude of the deflection. In one embodiment, the bias current is variable and/or alternating. In one embodiment, the method further includes converting the magnetic velocity to velocity-over-ground by normalizing the magnetic velocity for local field strength to form a normalized magnetic velocity and projecting the normalized magnetic velocity on a horizontal. In one embodiment, the calculating of the magnetic velocity includes temperature compensation. In one embodiment, the method further includes converting the potential to a digital form. In one embodiment, the determining of the potential includes analog and/or digital filtering.

For purposes of the current disclosure, the term precision is equivalent to the circular error probable metric used to quantify GPS accuracy, and the term accuracy represents magnitude and/or direction departure or current location from a designated transit path. Ground drift rate (GDR) represents growth rate of location uncertainty due to both imprecision and accuracy.

Referring now to the drawings in general, the illustrations are for the purpose of describing one or more preferred embodiments of the invention and are not intended to limit the invention thereto.

FIG. 1 illustrates one embodiment of an SLC 100. The SLC 100 includes at least one processor 102. In one embodiment, the at least one processor 102 is connected to at least one memory 104. The at least one processor 102 is connected to a direction finder 106 and/or a force sensor 108 (e.g., Lorentz force type drag sensor). The direction finder 106 and/or the force sensor 108 are operable to be of a scalar type or a vector type. In one embodiment, the SLC 100 further includes an input/output (I/O) unit 110. The I/O unit 110 is operable to receive input data and/or output navigation data or navigation control signals. In one embodiment, the SLC 100 includes an energy source 112 (e.g., battery). In one embodiment, the SLC 100 further includes a communications interface 114. In one embodiment, at least a portion of the SLC 100 is housed in a Faraday cage 116. The SLC 100 preferably includes a clock (e.g., in the processor) or is connected to a clock. In one embodiment, the SLC 100 includes a compensation unit 120. In one embodiment, the compensation unit 120 includes a magnetometer 122 and/or an attitude sensor 124.

In one embodiment, one or more of the at least one processor 102 is operable to process force signals to determine speed, velocity, and/or location as described herein. In one embodiment, one or more of the at least one processor 102 is operable to output navigation data, steering commands, and/or propulsion commands. In one embodiment, one or more of the at least one processor 102 is connected to the I/O unit 110. In one embodiment, the I/O unit 110 is incorporated in one or more of the at least one processor 102. In one embodiment, one or more of the at least one processor 102 is operable to communicate with at least one secondary device 140 via the I/O unit 110. In one embodiment, one or more of the at least one processor 102 is operable to directly connect to at least one secondary device 140. The at least one secondary device 140 includes, but is not limited to, a display, a guidance system, a navigation sensor, a navigation system, and/or an actuator.

In one embodiment, one or more of the at least one processor 102 is operable to run predefined programs stored in the at least one memory. In one embodiment, one or more of the at least one processor 102 is operable to determine a change in location by combining Lorentz force data over a plurality of time periods.

In one embodiment, one or more of the at least one processor 102 is operable to determine a current location by combining a change in location and an initial location. The at least one processor 102 is any type that is operable to process signals to form force signals (e.g., adjusted, calibrated, and/or normalized force signals) and/or derivatives thereof (e.g., location, change in location, speed, velocity, or steering commands). For example, one or more of the at least one processor 102 is operable to co-process force signals with direction signals to form field-normalized force signals.

In one embodiment, one or more of the at least one processor 102 is operable to perform predictive filtering, such as Kalman filtering. In one embodiment, the Kalman filtering is an extended Kalman filter. In one embodiment, the Kalman filtering is performed on at least one axial component of the magnetic field vector. Additionally or alternatively, the Kalman filtering is performed on the sensing unit signals. Advantageously, such filters provide an improved estimate of a signal by reducing its uncertainty.

By way of example, but not limitation, the at least one processor 102 is operable to be a general-purpose microprocessor (e.g., a central processing unit (CPU)), a graphics processing unit (GPU), a microcontroller, a Digital Signal Processor (DSP), an Application Specific Integrated Circuit (ASIC), a Field Programmable Gate Array (FPGA), a Programmable Logic Device (PLD), a controller, a state machine, gated or transistor logic, discrete hardware components, or any other suitable entity or combinations thereof operable to perform calculations, process instructions for execution, and/or other manipulations of information.

The at least one memory 104 is operable to store data of any type including, but not limited to, inputs, raw signals, and/or intermediate or processed signals, as well as the algorithms or methods of processing signals used by the SLC 100. In one embodiment, one or more of the at least one memory 104 is connected to the I/O unit 110.

The direction finder 106 determines orientation relative to the Earth's magnetic field lines in at least one dimension. In a preferred embodiment, the direction finder 106 is a compass of any type. The direction finder 106 is mechanical and/or electronic. In one embodiment, the direction finder 106 is of scalar or vector type. Advantageously, the vector direction finder is operable to detect field strength in a plurality of directions. In one embodiment, the direction finder 106 is a magnetized compass needle. In another embodiment, the direction finder 106 is an electronic compass. In one embodiment, the electronic compass is operable to determine the orientation to the field lines by measuring field intensity in two or three dimensions. In one embodiment, the direction finder 106 is an automated compass. In one embodiment, the automated compass includes a north-indicating magnetic needle mounted on a post further connected to a base (e.g., an orientation sensing base). In one embodiment, the automated compass includes an angular array of electrical and/or optical elements that is operable to detect the angular position of a compass needle. In one embodiment, the direction finder 106 is a gyrocompass. In one embodiment, the direction finder 106 is a magnetometer (e.g., vector magnetometer).

In one embodiment, the direction finder 106 is operable to detect direction relative to a radiofrequency (RF) source (e.g., cell tower, radio tower, a very high frequency omni-directional range/tactical aircraft control (VORTAC)) and/or an electro-optical source (e.g., a beacon light, heat source). In one embodiment, the direction finder 106 includes star recognition, obstacle detection, and/or landmark recognition.

The force sensor 108 is of any type (e.g., spinning disk, Faraday rod, dual loop sensing unit, among others) that is operable to provide a measurable potential induced by a Lorentz force. In one embodiment, the force sensor 108 includes at least one spatial Lorentz filter (SLF). In one embodiment, the force sensor is a scalar force sensor and/or a vector force sensor. Advantageously, a vector force sensor is operable to determine the Lorentz force in a plurality of directions (e.g., force induced by winds or currents acting on a vehicle). In one embodiment, the force sensor 108 is operable to isolate magnetic velocity signals from back-EMF or counter posing potential. In one embodiment, the force sensor 108 is operable to provide signals proportional to the Lorentz force induced by coupling of sensor charges with the magnetic field. Examples of force sensors and related components are disclosed in WIPO Publication No. WO2021146120; U.S. Pat. Nos. 9,243,915, 9,519,062, 8,965,318, and 9,800,078; and U.S. Provisional Patent Application No. 63/312,261, each of which is incorporated herein by reference in its entirety. For example, and not limitation, the Faraday rod is disclosed in WIPO Publication No. WO2021146120.

Orientation to the magnetic field and orientation to magnetic field lines are considered to be equivalent. The term charge represents electrons and/or holes in the case of a semiconductor. Lorentz force is a linear function of velocity through the field as illustrated by the cross product of velocity and field strength, v×B, with the potential induced by charge separation (E) being proportional to the length of the sensing element (l) with respect to the field as represented in the induced potential equation $E=vBl\sin\theta$, which is applicable at any velocity (including hypersonic) and at any altitude from the ocean depths to those of satellites. The at least one SLF is operable to isolate sensing element signals from back EMF that would other prevent local measurement of velocity during navigation.

In one embodiment, the force sensor includes at least one sensing unit (SU). The at least one sensing unit includes a sensing element (SE) and a measurement circuit (MC). In one embodiment, the at least one sensing unit is any type operable to isolate Lorentz force signals from adverse coupling (e.g., a dual loop or switchable Faraday-rod design). In one embodiment, the sensing element is any type that couples well with the Earth's magnetic field. In a preferred embodiment, the sensing element is formed of a semiconductor. In one embodiment, the measurement circuit is any type that couples poorly with the magnetic field. In one embodiment, the measuring circuit is any type that is operable to isolate the measurable potentials provided by the SE, for example, from masking or canceling phenomena (e.g., back-EMF due to adverse coupling to the field).

The force sensor 108 is operable to generate a velocity dependent potential (E) that is derived from Faraday's Law of Induction:

$$E = \frac{d\varphi}{dt} \quad \text{Equation 1}$$

where E is the induced potential and φ is magnetic flux. Replacing φ, which is defined as the product of magnetic field intensity (B) and area of the flux (A), yields the following equation:

$$E = B\frac{d(A)}{dt} \quad \text{Equation 2}$$

Defining A as the product of sensing element length (l) and its displacement (x) yields the following equation:

Equating $$\frac{dx}{dt}$$

to velocity, the above equation is operable to be written as the vector:

$$E = vBl\sin\theta \quad \text{Equation 4}$$

where θ is the direction of translation with respect to the field lines.

Rearranging this expression yields the magnetic velocity (MagV) function:

$$v = \frac{E}{Bl\sin\theta} \quad \text{Equation 5}$$

Quantifying the linearity of measured velocity with induced signal strength as modified for flux density and the length and orientation of the sensing element with respect to the field lines. MagV is operable to be further adjusted (e.g., using a calibration based on characteristics of individual SLC components).

In one embodiment, the force sensor includes a plurality of sensing units. The plurality of sensing units is preferably mounted in a non-parallel arrangement. In one embodiment, the plurality of sensing units is any type and/or arrangement operable to resolve directional components of field coupling into two or three non-parallel axis directions. By way of example, and not limitation, in one embodiment, the first sensing unit, the second sensing unit, and the third sensing unit are orthogonal to each other. In another non-limiting example, the first sensing unit is on a first axis (e.g., x-axis), the second sensing unit is on a second axis (e.g., y-axis), and the third sensing unit is between the first axis and the second axis (e.g., angled between the x-axis and y-axis). In one embodiment, the plurality of sensing units is operable to normalize force for field strength in each direction (e.g., x, y, z). This allows for detection and/or compensation for the effects of winds, currents, and/or wheel slip.

Additional details regarding the force sensor 108 are described infra.

As previously described, the I/O unit 110 is operable to receive input data and/or output navigation data or navigation control signals. The I/O unit 110 is in communication with one or more of the at least one processor 102. In one embodiment, the I/O unit 110 is included in the one or more of the at least one processor 102.

The I/O unit 110 is operable to receive various inputs including, but not limited to, an initial location, a local field strength, a force calibration, a field inclination, and/or a field intensity map, although none are required. The I/O unit 110 is operable to output data including, but not limited to, force signals, a current location, a direction, and/or a rate of location change.

In one embodiment, the I/O unit 110 includes and/or is connected to at least one secondary device including, but not limited to, a display, a guidance system, and/or a navigation actuator. In one embodiment, the at least one secondary device includes a guidance and navigation controller (GNC). In one embodiment, the at least one secondary device is any type that is operable to receive inputs (e.g., calibration, initial fix) and/or provide outputs (e.g., magnitude and/or direction of change in position, steering instructions). In a preferred embodiment, the I/O unit includes memory for storing data including, but not limited to, calibration data, initial location data, local field strength data, and/or navigation instructions. In one embodiment, the calibration data includes, but is not limited to, speed calibration data. In one embodiment, the speed calibration data is a default speed calibration data (e.g., factory calibration, measured once before use, manually entered prior to use). In one embodiment, the speed calibration data is provided via manual input (e.g., via the I/O unit 110) and/or a magnetometer signal (e.g., from the compensation unit 120).

For example, and not limitation, the SLC 100 is operatively connected to a navigation actuator (e.g., via the I/O unit 110). The navigation actuator is operable to alter magnitude and/or direction of navigation to compensate for path and/or position errors, which provides more accurate navigation. Examples of a navigation actuator include, but are not limited to, an electronic actuator operable to increase and/or decrease propulsion or a rudder operable to alter the direction of navigation. Advantageously, the navigation actuation is operable to correct for navigation errors and resume a desired direction and/or velocity.

The navigation actuator includes, but is not limited to, a rudder, a flap, or a steering box and a processor that is operable to form output steering commands to the navigation actuator to adjust navigation (e.g., to resume a desirable path).

The communications interface 114 is any wired and/or wireless communication interface for connecting to a network and by which information may be exchanged with other devices connected to the network. Examples of wired communication interfaces include, but are not limited to, USB ports, RS232 connectors, RJ45 connectors, Ethernet, and any combinations thereof. Examples of wireless communication interfaces include, but are not limited to, an Intranet connection, Internet, ISM, Bluetooth® technology, Wi-Fi, Wi-Max, IEEE 802.11 technology, radio frequency (RF), Near Field Communication (NFC), ZigBee, Infrared Data Association (IrDA) compatible protocols, Local Area Networks (LAN), Wide Area Networks (WAN), Shared Wireless Access Protocol (SWAP), any combinations thereof, and other types of wireless networking protocols. The wired and/or wireless communication interfaces includes, but is not limited to, magnetic induction (e.g., near-field magnetic induction (NFMI)), optical, and/or acoustic communication interfaces.

In one embodiment, the communications interface 114 is used to communicate, preferably wirelessly, with at least one remote device (e.g., a mobile phone, a tablet), at least one server, at least one additional SLC, and/or at least one vehicle. The mobile phone is operable to be any mobile phone that (1) is capable of running mobile applications and (2) is capable of communicating with the SLC. The mobile phone can be, for example, an ANDROID phone, an APPLE IPHONE, or a SAMSUNG GALAXY phone. Likewise, the tablet is operable to be any tablet that (1) is capable of running mobile applications and (2) is capable of communicating with the SLC. The tablet is operable to be, for example, an APPLE IPAD.

In one embodiment, the at least one remote device (e.g., the mobile phone, the tablet), the at least one server, the at least one additional SLC, and/or the at least one vehicle is in communication with a cellular network and/or a network. The network is operable to be any network for providing wired or wireless connection to the Internet, such as a local area network (LAN) or a wide area network (WAN).

In one embodiment, a SLC mobile application is installed and running at the at least one remote device (e.g., the mobile phone, the tablet). The SLC mobile application is implemented according to the type (i.e., the operating system) of the at least one remote device (e.g., the mobile phone, the tablet) on which it is running. The SLC mobile application is designed to receive information (e.g., location, velocity) from the SLC. The SLC mobile application is operable to graphically and/or audibly indicate the information (e.g., location, velocity) from the SLC.

In one embodiment, the communications interface 114 is operable to exchange information between at least two SLCs. For example, and not limitation, a first communications interface of a first SLC in a first vehicle is operable to exchange information with a second communications interface of a second SLC in a second vehicle.

As previously described, in one embodiment, at least a portion of the SLC 100 is housed in a Faraday cage 116. In one embodiment, the Faraday cage 116 surrounds the at least one measurement circuit and/or the at least one sensing element of the force sensor 108. The Faraday cage 116 is operable to block electromagnetic interference (e.g., generated by vehicle components such as an electric motor, actuator, switch, or power cable).

In one embodiment, the SLC 100 further includes at least one compensation unit 120. The at least one compensation unit 120 is operable to provide signals that are operable to compensate force signals. The at least one compensation unit 120 includes, but is not limited to, a magnetometer 122 and/or an attitude sensor 124.

The magnetometer 122 is operable to detect field intensity in at least one direction. In one embodiment, the magnetometer 122 is a scalar magnetometer. Alternatively, the magnetometer 122 is a vector magnetometer. Signals related to the field intensity are operable to be used to normalize force sensor signals for variations in field strength in converting drag force into velocity and/or location.

The attitude sensor 124 is operable to determine orientation and/or transit direction with respect to gravity, the surface of the Earth, the horizon, celestial bodies, obstructions, and/or landmarks. Examples of attitude sensors compatible with the present invention include, but are not limited to, a gravity sensor, a gyroscope set, an obstacle avoidance system, and/or a map following sensor. In one embodiment, signals from the attitude sensor 124 are operable to convert velocity through the field to velocity over ground.

In one embodiment, the compensation unit 120 is at least one inertial measurement unit (IMU) or at least one inertial navigation system (INS). The at least one IMU and/or the at least one INS is operable to provide signal processing of SLC signals. In one embodiment, the at least one IMU and/or the at least one INS includes at least one IMU and/or INS processor. In one embodiment, the at least one IMU and/or the at least one INS further includes at least one IMU and/or INS memory operably connected to the at least one IMU and/or INS processor. In one embodiment, the signal processing of the SLC signals includes sensor fusion, trajectory smoothing, and/or Kalman or other filtering to provide more accurate measures of velocity and/or location. Advantageously, an SLC including the at least one IMU and/or the at least one INS is operable to provide more accurate velocity sensing during periods of high acceleration (e.g., during evasive maneuvers).

In one embodiment, the compensation unit 120 is operable to isolate sensing unit signals from the effect of disturbances (e.g., maneuvering, buffeting, jarring, vibration). For example, and not limitation, IMU signals are operable to be used to filter magnetic velocity signals to remove force signals induced by the disturbances (e.g., to estimate along a track or other aspects of velocity more accurately). In some cases, IMU signals are operable to be processed to estimate velocity during periods of magnetic navigation (e.g., during evasive or other high rate of change maneuvering).

In one embodiment, the SLC 100 includes at least one gimbal 130. In one embodiment, the at least one gimbal 130 is operable to orient the SLC 100 (e.g., based on feedback from the magnetometer 122) with respect to field lines, gravity, or other desired direction, field, and/or signal source. In one embodiment, the at least one gimbal 130 includes an active gimbal and/or a passive gimbal. One example of an active gimbal is a servo-controlled gimbal. In one embodiment, the servo-controlled gimbal is oriented using a feedback method or a feed-forward method. In one embodiment, the feedback method maximizes strength of a signal from the force sensor 108. In one embodiment, the feed-forward method calculates and makes an open loop adjustment calculation based on at least one signal (e.g., from the magnetometer 122). In another embodiment, a base of the direction finder 106 is mounted on the gimbal 130 that is operable to orient with respect to gravity and/or the magnetic field.

Figure 2:
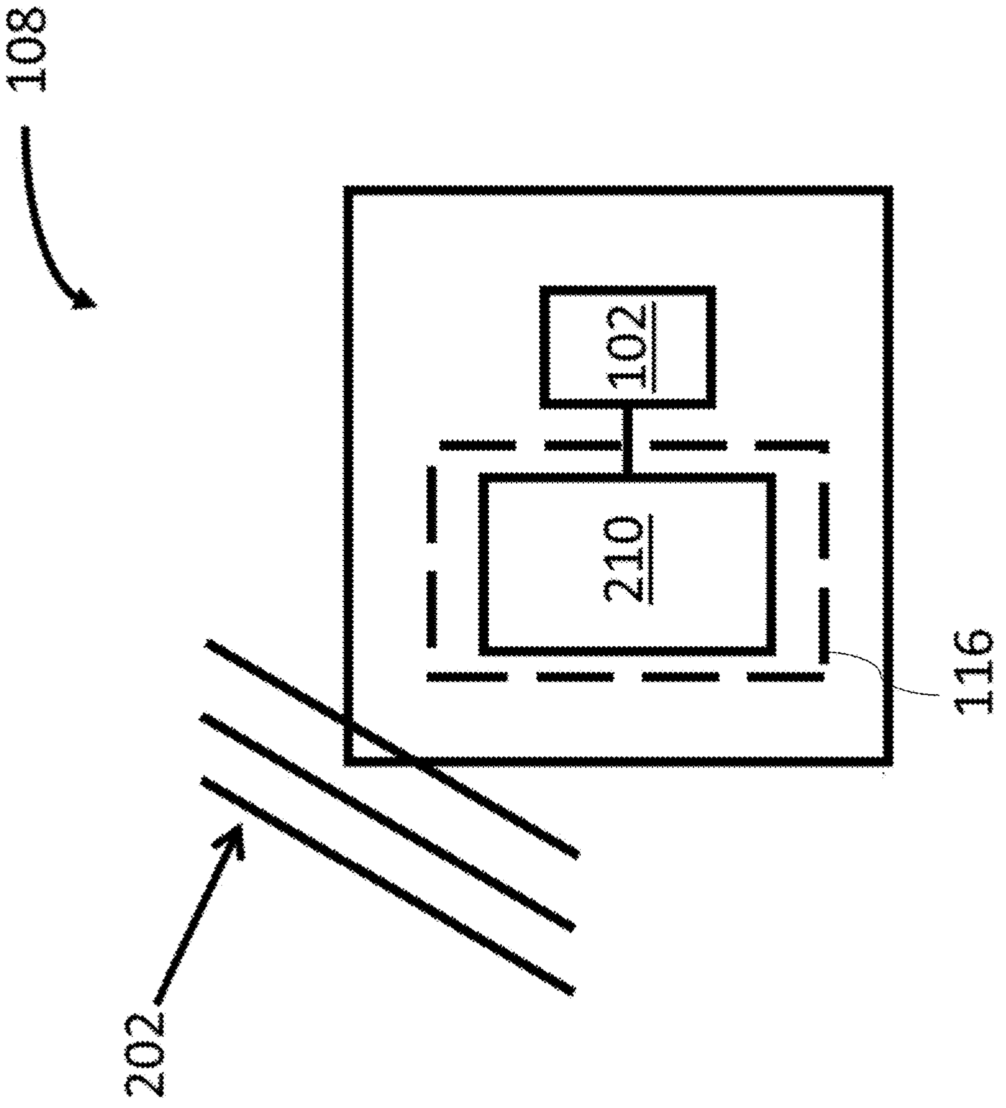
FIG. 2 illustrates one embodiment of a force sensor.

FIG. 2 illustrates one embodiment of a force sensor 108. The force sensor 108 is operable to measure the effect of coupling of a magnetic field 202 with the force sensor 108 moving with respect to the magnetic field 202. The force sensor 108 includes at least one sensing unit 210. The at least one sensing unit 210 is connected to one or more of the at least one processor 102. The at least one processor 102 is operable to determine velocity through the magnetic field and/or over ground by processing signals from the at least one sensing unit 210. As previously described, the at least one processor 102 is operable to be connected to one or more of the following: at least one memory, a direction finder, an input/output (I/O) unit, an energy source, a communications interface, a compensation unit, a magnetometer, an attitude sensor, and/or a secondary device. The embodiment shown in FIG. 2 includes a Faraday cage 116 around the at least one sensing unit 210. As previously described, the at least one sensing unit 210 includes at least one sensing element and at least one measurement circuit. The Faraday cage 116 is operable to block coupling of non-direct current (DC) aspects of the magnetic field 202.

In a preferred embodiment, the at least one sensing unit 210 is operable to detect coupling with a magnetic field. In one embodiment, the magnetic field has a strength of less than 5 mT. In another embodiment, the magnetic field has a strength between 1 μT and 750 μT (e.g., between 150 μT and 650 μT). Alternative magnetic field strengths are compatible with the present invention.

Figure 3:
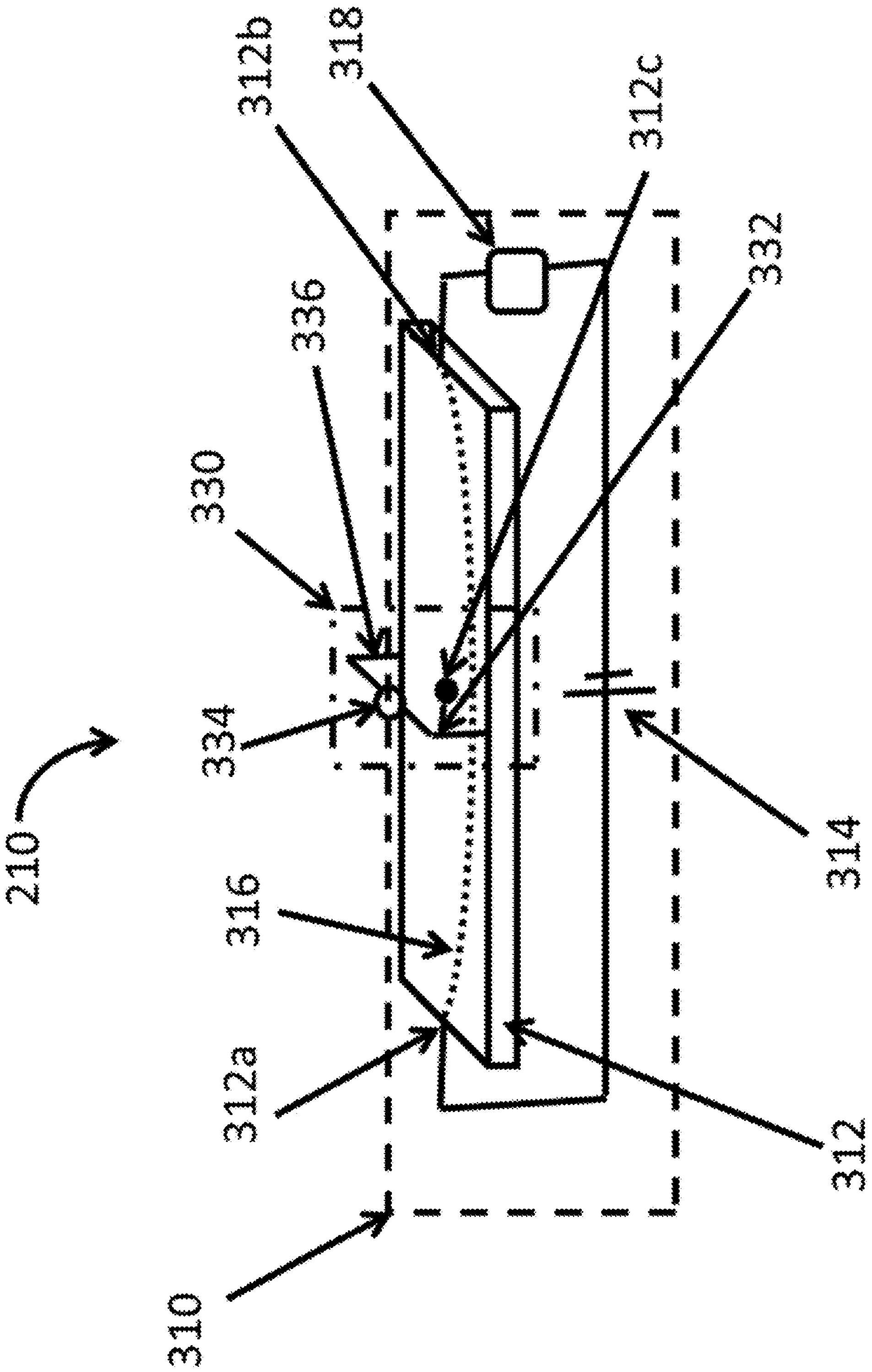
FIG. 3 illustrates one embodiment of the at least one sensing unit.

FIG. 3 illustrates one embodiment of the at least one sensing unit 210. As previously described, the at least one sensing unit 210 is preferably formed from a material having a slow charge relaxation rate (e.g., a semiconductor). The at least one sensing unit 210 is operable to be a single layer or a multi-layer sensing unit.

The at least one sensing unit 210 includes a first loop 310 and a second loop 330. In one embodiment, the first loop 310 has a length greater than or equal to the second loop 330. In one embodiment, the second loop 330 is oriented across the first loop 310 (e.g., perpendicular).

The first loop 310 includes a first sensing element 312 having a source type first end **312*a*, a sink type second end 312*b*, and a midpoint 312*c*. The first sensing element 312 is connected to a battery 314 at the source type first end 312*a* and the sink type second end 312*b*. The battery 314 provides a bias current 316. The bias current 316 that runs between the source type first end 312*a* and the sink type second end 312*b* is deflected by the Lorentz drag force. In one embodiment, the bias current 316 is between about 0.01 mA and about 10 A. The bias current 316** is of any directional type, including, but not limited to, direct current (DC), alternating current (AC), fixed, variable, intermittent, spinning, reversible, dynamic, and/or interruptible.

The second loop 330 is operable to measure the resulting potential. The second loop 330 includes a first conductor 332 coupled between the first side of the sensing element 312 and a measurement circuit 334 that is further connected to a second conductor 336 that is still further connected to the second side of the sensing element 312. Deflection of the bias current 316 by field coupling induces a potential between the first conductor 332 and the second conductor 336. The first conductor 332 and the second conductor 336 are preferably formed of a fast-relaxing material (e.g., copper). In one embodiment, the first conductor 332 and the second conductor 336 are at least partly aligned across the sensing element 312. It will be understood by those versed in the art that the potential in the sensing element 312 between first conductor 332 and second conductor 336 represents completion of the second loop 330. Advantageously, the design of the at least one sensing unit 210 prevents adverse coupling and, thereby, prevents a back-EMF (electromagnetic force) that would cancel the sensing element signal, which would make local velocity sensing impossible.

The measurement circuit 334 is preferably operable to provide coupling reducing, low pass filtering, current amplifying, potential amplifying, and/or analog to digital (A/D)

converting. For example, and not limitation, in one embodiment, the measurement circuit 334 includes a galvanometer connected at a first end to the first conductor 332 and at a second end to the second conductor 336 and to an A/D converter that is further connected to an output of the measurement circuit 334. In one embodiment, the galvanometer includes a chopper amplifier. In one embodiment, a low pass filter is connected between the galvanometer and the A/D converter. In one embodiment, at least one additional filter is connected between the low pass filter and the A/D converter. In one embodiment, at least one additional low pass filter is connected between the second amplifier and the A/D converter. In one embodiment, a digital filter is connected between the A/D convert and the output. In one embodiment, the A/D converter is of a dual ramp type.

The length of the measurement circuit 334 preferably is small relative to the width of the sensing element 312. In one embodiment, the measurement circuit 334 has a high impedance relative to the impedance of the sensing element 312. In one embodiment, the measurement circuit includes a temperature compensation unit.

In one embodiment, the measurement circuit 334 includes an input connected to an amplifier that is further connected to an A/D converter that is still further connected to an output that is connected to one or more of the at least one processor. In one embodiment, the measurement circuit 334 includes an analog filter connected between the amplifier and the A/D converter. In one embodiment, a digital filter is connected between the A/D converter and the output. In one embodiment, one or more of the amplifier, the converter, the analog filter, and the digital filter are adjustable before and/or during use. In one embodiment, the amplifier is any type including, but not limited to, the following types: chopper, low noise, fixed gain, or variable gain. In one embodiment, the analog-to-digital converter is operable to be of any resolution, providing digital signals of any desirable bit length.

In one embodiment, the first conductor 332 and/or the second conductor 336 have a length between 1 percent and 70 percent of the distance across the sensing element 312. In one embodiment, the first conductor 332 and/or the second conductor 336 are aligned more or less directly across the sensing element 312. In one embodiment, the measurement circuit 334 is short relative to the distance across the sensing element 312. Elements of the measurement circuit 334 preferably are small and are fabricated of a material with a charge-relaxation rate higher than that of the sensing element 312.

In one embodiment, the at least one sensing unit 210 is thin relative to its length and/or width (e.g., a film). In one embodiment, the at least one sensing element 312 has a length to width ratio between 1:1 and 100:1. In one embodiment, the at least one sensing element 312 has length to width ratio between 0.5:1 and 50:1. In one embodiment, the at least one sensing element 312 has a length between 10 μm and 10 m. In one embodiment, the length is proportional to expected velocity through the field.

In one embodiment, the first loop 310 includes a controller 318 operable to alter at least one of: temperature, charge relaxation rate, bias current amperage, bias current potential, and bias drift.

In one embodiment, the at least one sensing unit includes a first loop 310 and two additional loops. The first loop includes a sensing element sensing element 310 having a source type connection to the battery 314 at the midpoint 312*c* and sink type connections at the first end 312*a* and the second end 312*b* to the opposite pole of the battery 314. The midpoint 312*c* is small relative to the length and/or the width of the first sensing element 312. A first additional loop is mounted across the sensing element 312 and midway between the source type connection at the midpoint 312*c* and the first end 312*a* and a second additional loop is mounted across the sensing element 312 midway between the source type connection at the midpoint 312*c* and the sensing element second end 312*b*.

In one embodiment, the at least one sensing unit (e.g., a sensing unit, a sensing unit array) is operable to be mounted on a gyroscope for orientation with respect to the magnetic field lines.

Although the sensing element is described in terms of a semiconductor, the present invention is compatible with other types of sensing elements including, but not limited to, quantum-well or magneto-resistive type materials that have a charge relaxation slower than that of a metal.

Although the second loop is described in terms of conducting materials, the present disclosure is compatible with other types of materials including, but not limited to, optical materials and/or circuitry, as well as semiconductor components.

Figure 4:
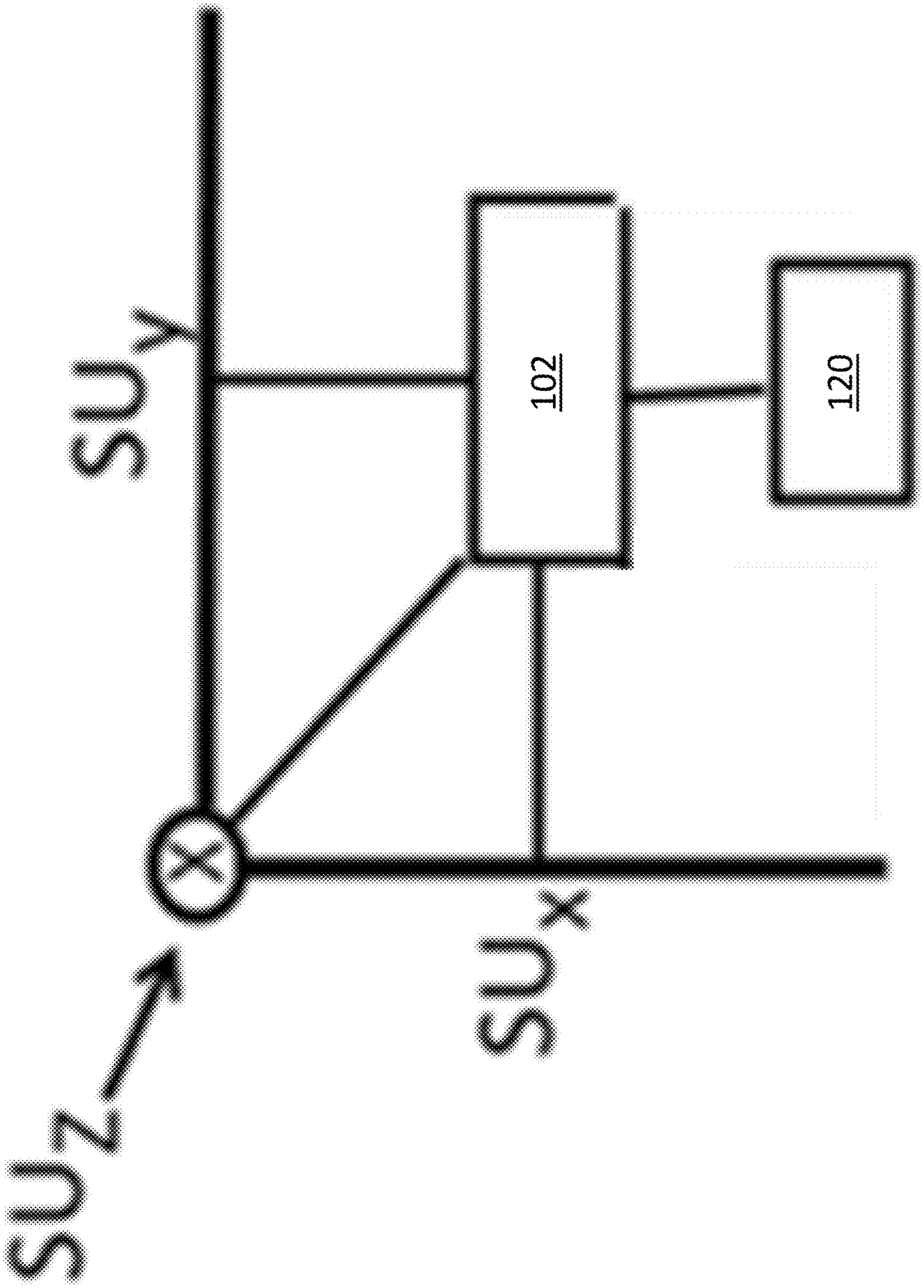
FIG. 4 illustrates one embodiment of a three-dimensional (3-D) array of sensing units.

FIG. 4 illustrates one embodiment of a three-dimensional (3-D) array of sensing units. The 3-D array of sensing units includes a first sensing unit ($SU_x$), a second sensing unit ($SU_y$), and a third sensing unit ($SU_z$). The first sensing unit, the second sensing unit, and the third sensing unit are non-parallel to each other. In one embodiment, the first sensing unit, the second sensing unit, and the third sensing unit are orthogonal to each other. The 3-D array of sensing units is connected to one or more of the at least one processor 102. The one or more of the at least one processor 102 is connected to a compensation unit 120. In one embodiment, the compensation unit is an inertial measurement unit (IMU). The IMU is operable to provide magnetometer and attitude signals that are operable to be fused with the MagV vector. In a preferred embodiment, the one or more of the at least one processor uses raw IMU signals. Advantageously, the use of raw IMU signals instead of integrated IMU signals avoids the fast-accumulating errors that plague INS. Further, MagV measures velocity with respect to the magnetic field lines, which are fixed to the Earth, enabling detection of wind drift. In one embodiment, the raw IMU signals are operable to be integrated (e.g., over a brief period of time) to estimate instantaneous velocity.

MagV avoids the integration errors of INS by measuring velocity instead of acceleration. In at least one embodiment, MagV uses non-integrated IMU signals. In one embodiment, the non-integrated IMU signals undergo Kalman filtering to reduce variability as part of the fusion described above.

In one embodiment, MagV is compared to concurrent IMU velocity estimates to detect changes in magnetic field strength or orientation. For example, and not limitation, changes in magnetic field strength or orientation may be induced by close flight past a radio tower or cars driving in the opposite direction that include steel and/or iron. An autonomous vehicle might sense these changes in magnetic field strength or orientation and attempt to correct its trajectory, which may cause a crash. Advantageously, comparing the fast changing magnetic vector with velocity estimated using the IMU signals is operable to reject the changes in the magnetic field.

Figure 5:
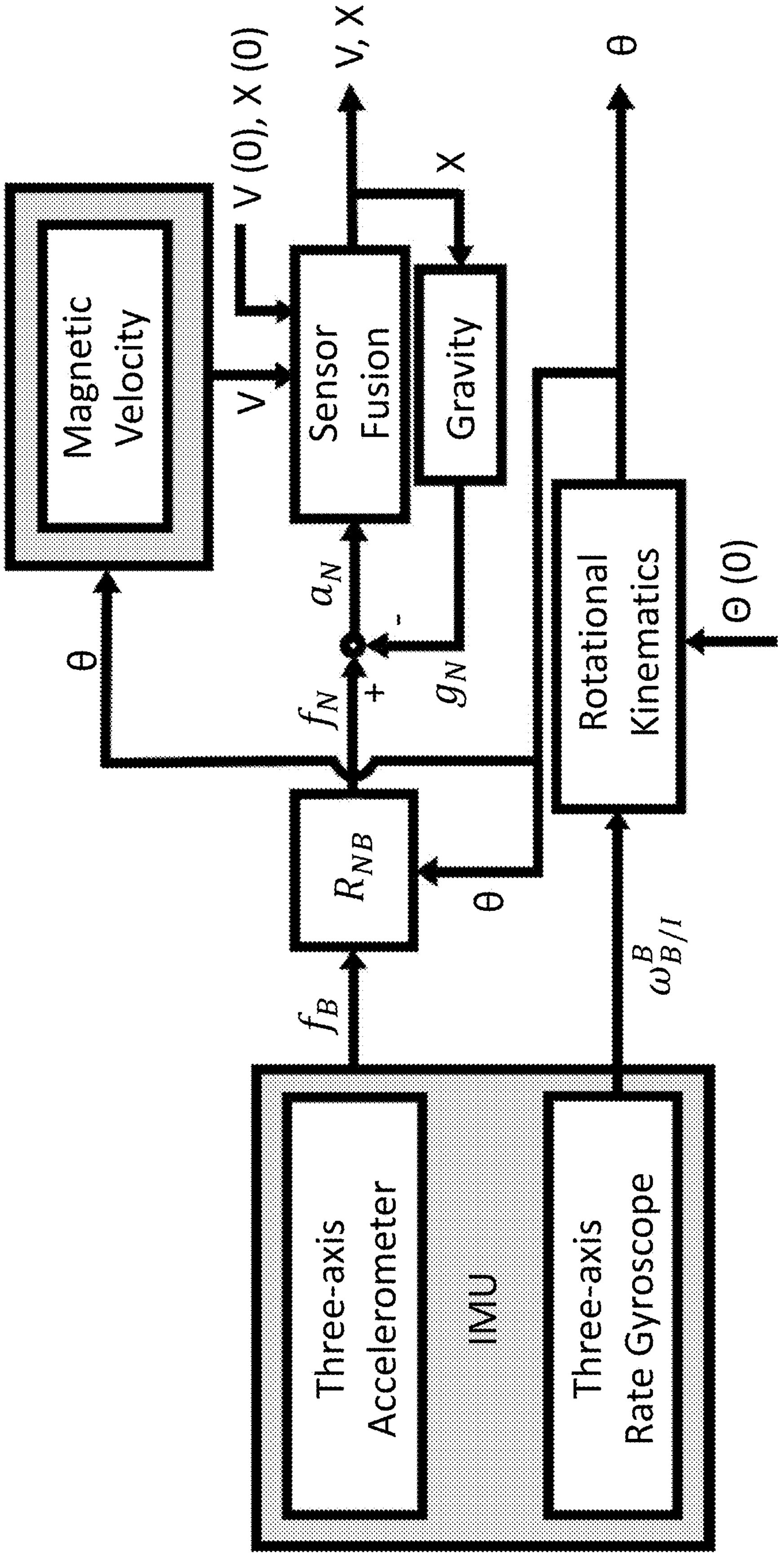
FIG. 5 illustrates fusion of MagV with IMU signals.

FIG. 5 illustrates fusion of MagV with IMU signals (e.g., by a fusion engine in an INS). In one embodiment, MagV signals are operable to be used to reset INS error. MagV also measures velocity over ground instead of locally, eliminating wind drift errors.

Figure 6:
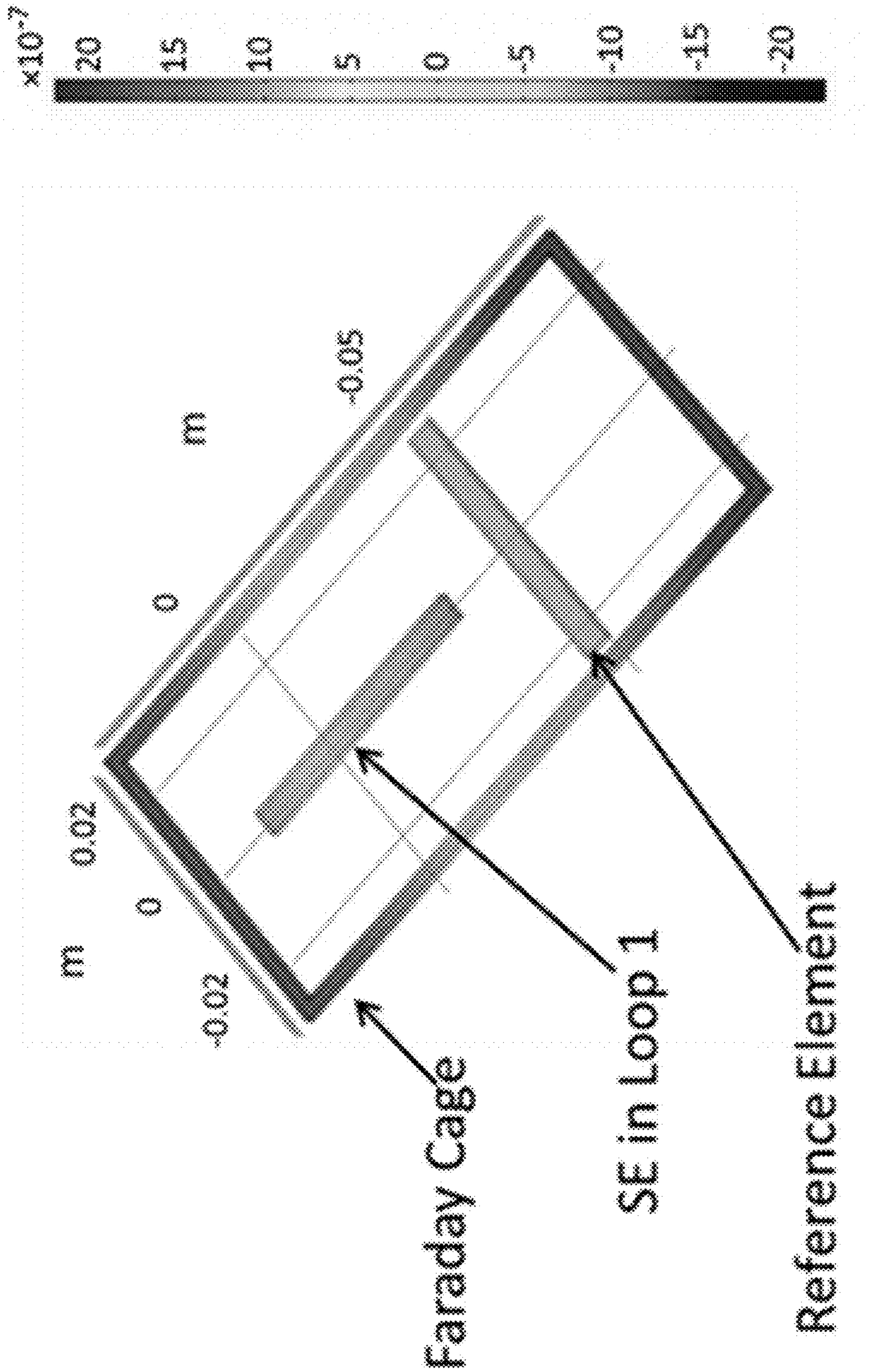
FIG. 6 illustrates one embodiment of a force sensor according to the present invention.

FIG. 6 illustrates one embodiment of a force sensor according to the present invention. The force sensor includes a Faraday cage enclosing at least one sensing unit (illustrated as a Faraday rod). The Faraday cage is operable to isolate MagV signals from electromagnetic interference (EMI) and other extraneous field effects. In one embodiment, the at least one sensing unit includes a passive sensing element (SE) traveling across the field lines. In a Faraday rod, the Lorentz drag force acting on the SE induces a charge separation (i.e., electrons are forced towards one end of the rod and holes towards the other end), quantified by MagV.

Figure 7:
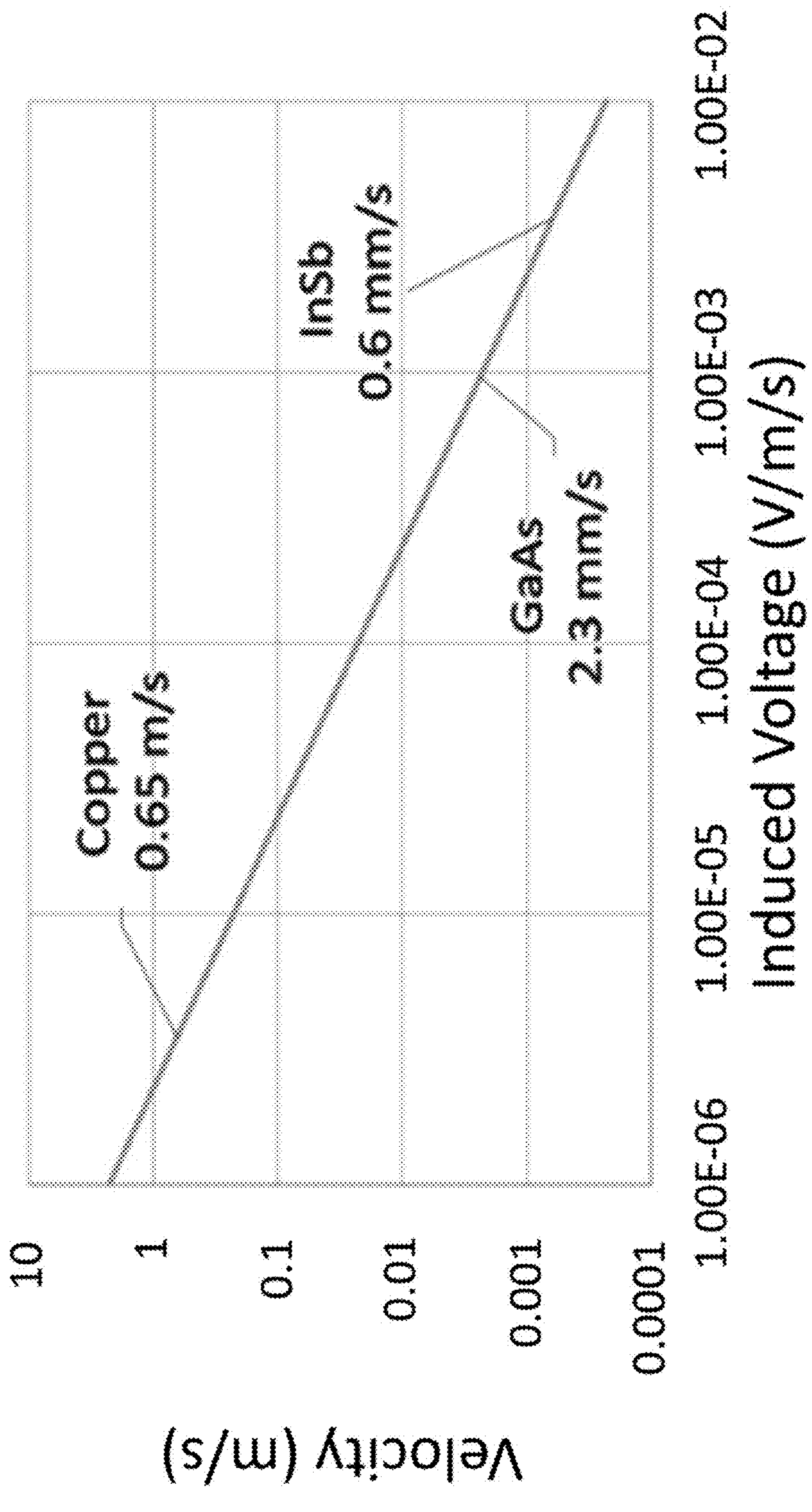
FIG. 7 illustrates sensitivities of copper, gallium arsenide, and indium antimonide.

As previously described, the sensing element is preferably formed of a semiconductor. Advantageously, semiconductor materials provide greater sensitivity. FIG. 7 illustrates sensitivities of copper, gallium arsenide (GaAs), and indium antimonide (InSb). For example, and not limitation, indium antimonide provides three orders of magnitude greater sensitivity than copper.

Figure 8:
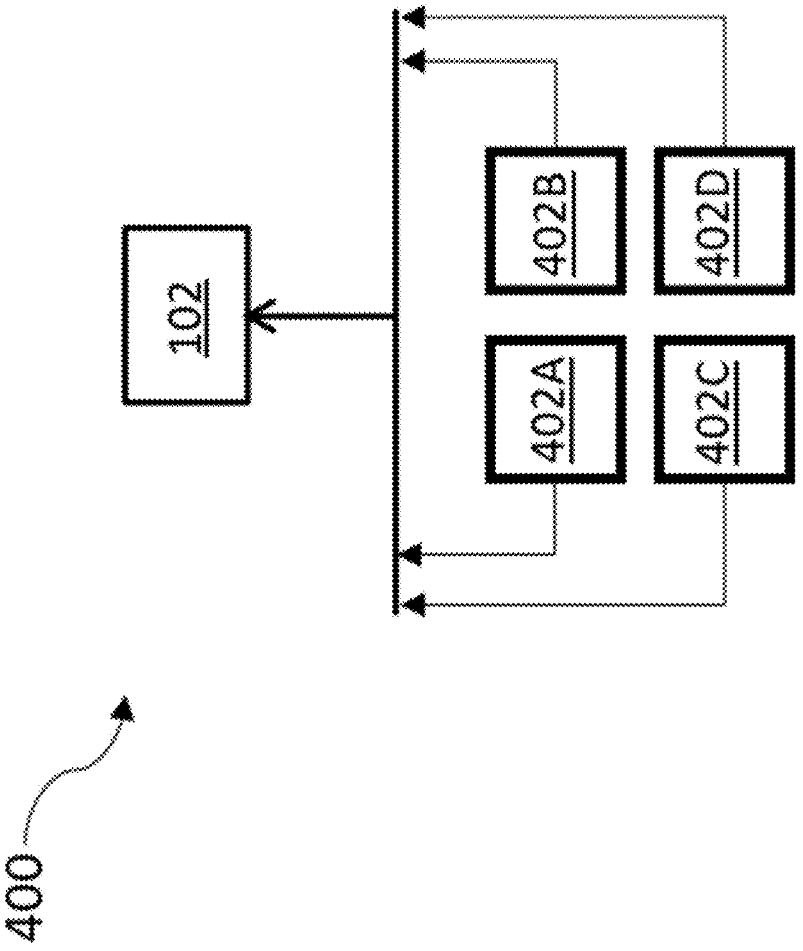
FIG. 8 illustrates a plurality of IMUs arrayed to provide a plurality of fusible input signals.

FIG. 8 illustrates an array of IMUs 400. A plurality of IMUs (402A-402D) are arrayed to provide a plurality of input signals (e.g., magnetometer and/or attitude signals) that are operable to be fused to form a plurality of improved signals (e.g., improved magnetometer and/or attitude signals). In one example, output magnetometer signals and/or output attitude signals from the plurality of IMUs (402A-402D) are fused (e.g., by Kalman filtering) using one or more of the at least one processor 102. In another embodiment, constituents of the output attitude signals are fused by signal type (e.g., fused gravity signals, fused accelerometer signals, and fused gyroscope signals), with the resulting fused constituent attitude signals formed into an improved attitude signal. Although FIG. 8 includes four IMUs (402A-402D), the present invention is not limited to four IMUs and is compatible with any number of IMUs (e.g., two IMUs, three IMUs, five IMUs, etc.).

The type of direction finder (e.g., compass), force sensor, and/or compensation unit are operable to be selected for performance and/or cost according to intended use. For example, and not limitation, a 2-axis magnetometer is adequate for horizontal navigation, e.g., by a Special Operations go-fast boat or by a self-driving race car competing in a race (e.g., the Baja 500). In cases where vertical movement is of interest (e.g., drone, electric vertical takeoff and landing vehicle (eVTOL)), signals provided by a 3-axis type magnetometer are preferable. Navigation requirements (e.g., of aircraft) preferably use a triaxial type force sensor, with certain applications (e.g., passenger aircraft) preferring use of a more accurate, more expensive force sensor and/or compensation unit, while low-cost and less accurate components are suitable in hobby drones. The force sensor is operable to be of a scalar or a vector type of appropriate dimensionality. For example, and not limitation, a biaxial type for self-driving cars or a triaxial type for aircraft.

The accuracy and precision of velocity and/or position determined by SLC depend at least partly on the quality of SLC components. For example, but not limitation, a high-quality electronic compass or magnetometer makes possible more accurate determination of velocity and position than would their low cost, typically low quality, equivalents.

Similarly, a high-quality attitude subunit is operable to provide improved conversion of speed or velocity through the field to provide more accurate ground velocity and position. A high-quality force sensor (e.g., having a finer resolution) is operable to calculate velocity at higher resolution and, thereby, determine location with greater precision.

In some embodiments, the SLC includes a direction finder (e.g., compass) operable to resolve field strength in at least two directions, providing normalizing signals that would otherwise be provided by a magnetometer. It will be appreciated by one of ordinary skill of the art that while a vector type electronic compass is operable to both determine direction with respect to the magnetic field, including its angle of inclination, and provide field intensity signals for normalizing drag signals to form a normalized velocity vector, low-quality signals provided by a low cost 9- or 10-axis type IMU or INS may cause velocity and position errors. While such errors are acceptable in some applications, other applications require higher quality signals, dictating the use of more expensive components.

It is well known that magnetometers typically have update rates less than 100 Hz. In cases where abrupt changes in direction (e.g., during evasive maneuvering) require higher velocity update rates, an INS type attitude unit is operable to be used to interpolate velocity. The results of the velocity interpolation are operable to be concatenated with periods of navigation by magnetic velocity sensing to determine current location more accurately.

By way of example, and not limitation, an SLC designed for low-cost applications includes a scalar direction finder (e.g., compass) operable to maintain orientation with respect to the field lines and/or normalize force signals that are operable to be used to normalize force for variations in field intensity. However, this SLC is not operable to measure wind or current drift, allowing a vehicle drift off course undetected.

In another non-limiting example, an SLC includes a low-cost, low-resolution force sensor, which results in lower velocity resolution and, as a result, less precise determination of location.

In one embodiment, the SLC provides a velocity resolution of between about 1 μm/s and about 1 m/s. In one embodiment, the SLC provides a velocity resolution of less than 1 m/s. In another embodiment, the SLC provides a velocity resolution of less than 0.5 m/s. In yet another embodiment, the SLC provides a velocity resolution of less than 50 μm/s. In still another embodiment, the SLC provides a velocity resolution of less than 10 μm/s. In another embodiment, the SLC provides a velocity resolution of less than 5 μm/s. In yet another embodiment, the SLC provides a velocity resolution of less than 1 μm/s.

The SLC has a drift rate between 0.01 m/hr and 100 km/hr. In one embodiment, the SLC has a drift rate of less than 100 km/hr. In one embodiment, the SLC has a drift rate of less than 50 km/hr. In one embodiment, the SLC has a drift rate of less than 8 km/hr. In one embodiment, the SLC has a drift rate of less than 4 km/hr. In one embodiment, the SLC has a drift rate of less than 2 km/hr. In another embodiment, the SLC has a drift rate of less than 0.2 km/hr. In yet another embodiment, the SLC has a drift rate of less than 0.1 km/hr. In one embodiment, the SLC has a drift rate of less than 80 m/hr. In still another embodiment, the SLC has a drift rate of less than 50 m/hr. In another embodiment, the SLC has a drift rate of less than 20 m/hr. In yet another embodiment, the SLC has a drift rate of less than 10 m/hr. In one embodiment, the SLC has a drift rate of less than 8 m/hr. In another embodiment, the SLC has a drift rate of less than 5 m/hr. In yet another embodiment, the SLC has a drift rate of less than 1 m/hr. In a more preferred embodiment, the SLC has a drift rate of less than 0.4 m/hr (e.g., 0.35 m/hr). In another preferred embodiment, the SLC has a drift rate of less than 0.1 m/hr. In yet another preferred embodiment, the SLC has a drift rate of less than 0.01 m/hr.

SLCs of the present invention differ from inertial navigation systems (INSs) in the ability to detect wind and/or current drift, which INSs are incapable of measuring. Thus, drift rates for INSs estimate sensor error only. As a result, INS drift rates can substantially underestimate error when compared to SLCs, which are characterized by a total total drift rate, including wind and/or current drift.

TABLE 1

| Class | INS drift rate | SLC drift rate |
| --- | --- | --- |
| Strategic Class | 83 m/hr | 8 m/hr |
| Navigational Class | 2 km/hr | 0.2 km/hr |
| Tactical Class | 20 km/hr | 2 km/hr |
| Hobby Class | 40 km/hr | 4 km/hr |

Referring to Table 1, a notional strategic class SLC with a drift rate of 8 meters per hour outperforms a strategic class INS by a factor of 10 even before wind or current drift is considered. By way of example, and not limitation, a submarine relying on its INS alone can drift unaware more than a mile in a day off course, with potentially dire consequences. Similarly, a notional navigational grade SLC outperforms a navigation grade INS even before its ability to measure wind drift is taken into account. With a drift rate of 2 km per hour, a navigational grade INS could easily cause an aircraft to wander into restricted airspace, again to potentially dire consequences. Further, a tactical class SLC outperforms a tactical grade INS by an order of magnitude and more when wind and current effects are included. Lastly, a SLC suitable for hobby drones outperforms a hobby class INS by at least a factor of 10.

Figure 9A:
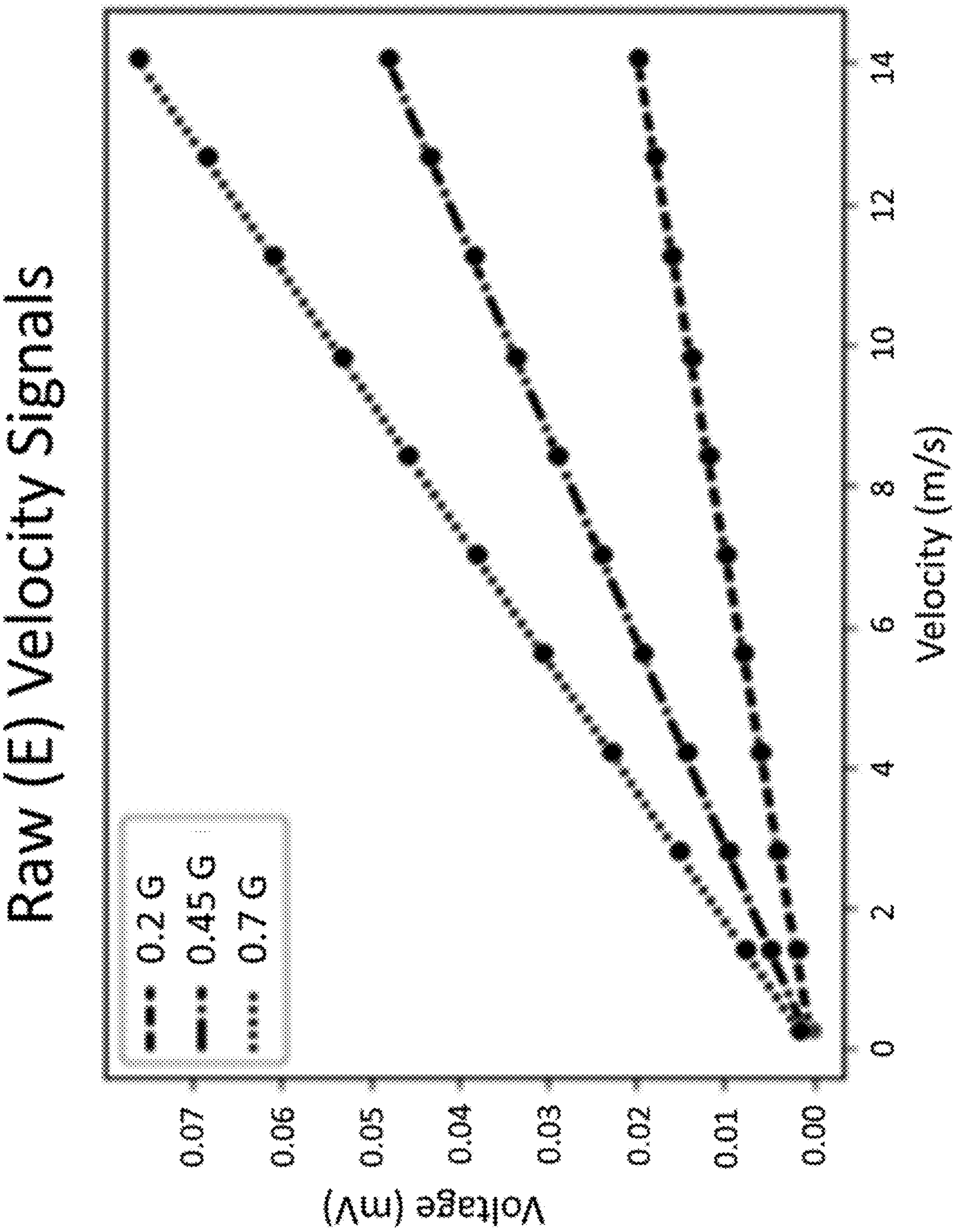
FIG. 9A illustrates electromagnetic simulations for a sensing unit traveling horizontally over ground.
Figure 9B:
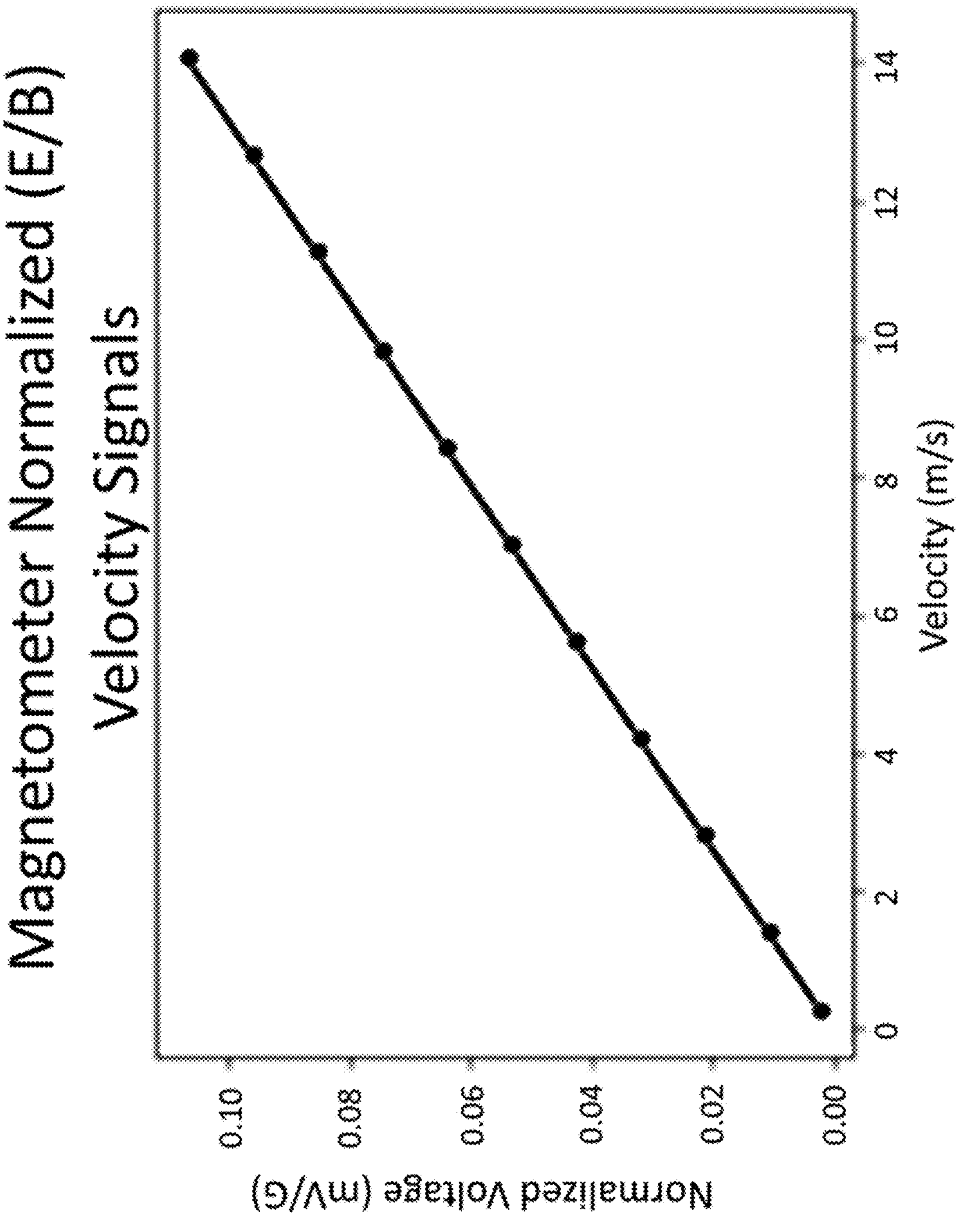
FIG. 9B illustrates the simulations of FIG. 9A normalized for field intensity.
Figure 9C:
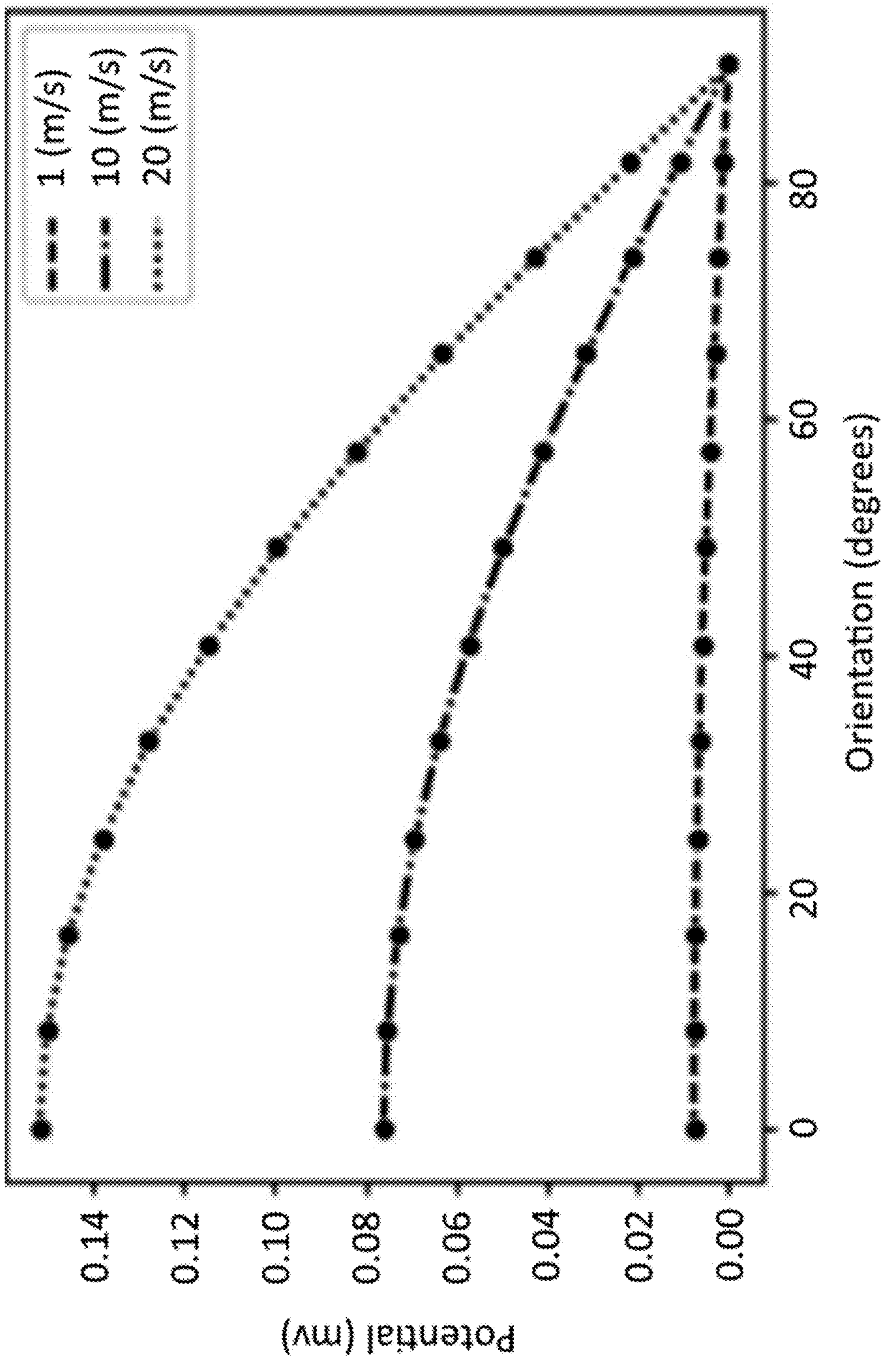
FIG. 9C illustrates simulations of induced signal strength as a function of translation direction with respect to the field lines at several velocities.

FIGS. 9A-9C illustrate simulations of magnetic velocity using Equation 5. The simulations use $l=10$ cm and $\theta=90°$.

FIG. 9A illustrates electromagnetic simulations for a sensing unit traveling horizontally over ground, demonstrating the linear dependence of MagV potential on speed over ground. FIG. 9A illustrates simulations at field strengths bracketing the normal range of the Earth's magnetic field (i.e., from 0.2 G to 0.7 G), including a mid-range (0.45 G) intensity.

FIG. 9B illustrates the simulations of FIG. 9A normalized for field intensity. With all values falling on the same line, the figure indicates velocity is operable to be measured accurately anywhere in the Earth's magnetic field by normalizing sensing unit signals for local field intensity. In one embodiment, normalizing sensing unit signals includes forming the amplitude ratio of sensing unit and field intensity signals (E/B) or a ratio of their Kalman filtered quantities (e.g., $E_K/B_K$).

Normalizing typically is conducted with concurrent field intensity readings (e.g., from a magnetometer). However, in some cases (e.g., in duration of a tactical or hobby drone), normalizing is operable to be conducted with reasonable accuracy using field intensity stored in memory prior to initializing movement of the vehicle (e.g., a flight).

FIG. 9C illustrates simulations of induced signal strength as a function of translation direction with respect to the field lines at several velocities. As shown in FIG. 9C, signal strength is greatest when the direction of transit is orthogonal to the field lines and trends to zero when transit approaches parallel to the lines.

The simulations shown in FIGS. 9A-9C were conducted for low speeds (average <10 m/sec) but are linear without limit at achievable velocities (e.g., less than the speed of light). Advantageously, this linearity allows for calibrations conducted at moderate velocities (e.g., less than 15 m/sec) to be used at high velocities. Signals are operable to become very large at high velocities as shown in Equation 4. The portion of the signal above that required to determine drift rate is operable to be used to make tradeoffs in sensor design and/or use while maintaining a specified drift rate. The MagV signal includes the potential determined by simulation plus additional potential generated by faster travel, the latter defined herein as velocity gain.

Figure 10A:
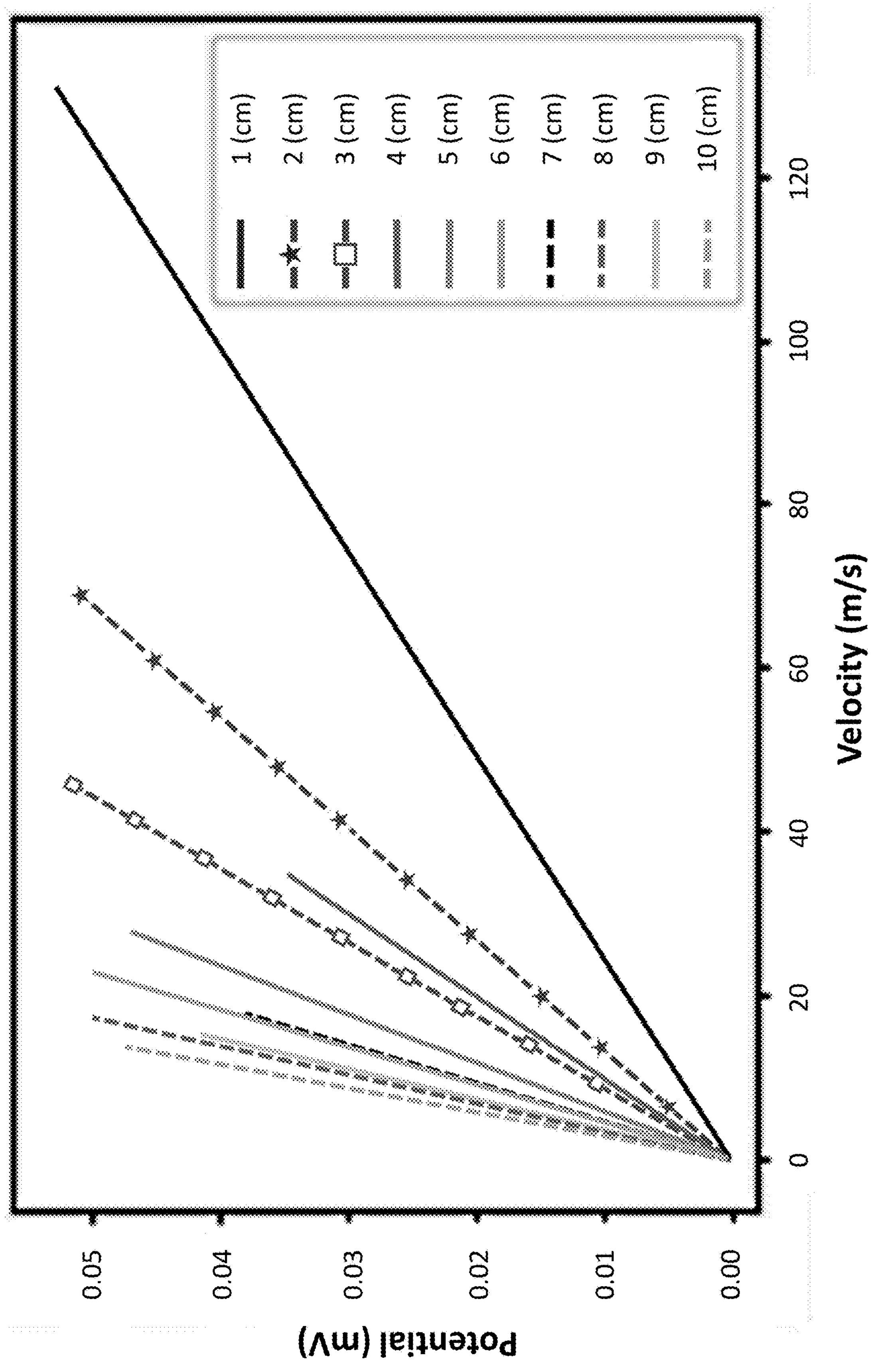
FIG. 10A shows induced potential as a function of velocity over ground and sensing element lengths.

FIG. 10A illustrates the effect of sensing element length on sensing unit signal strength, as indicated by the slope of the plots for sensing elements of lengths from 1 to 10 cm. As shown in FIG. 10A, SE strength and, therefore, velocity resolution, increases with length.

Figure 10B:
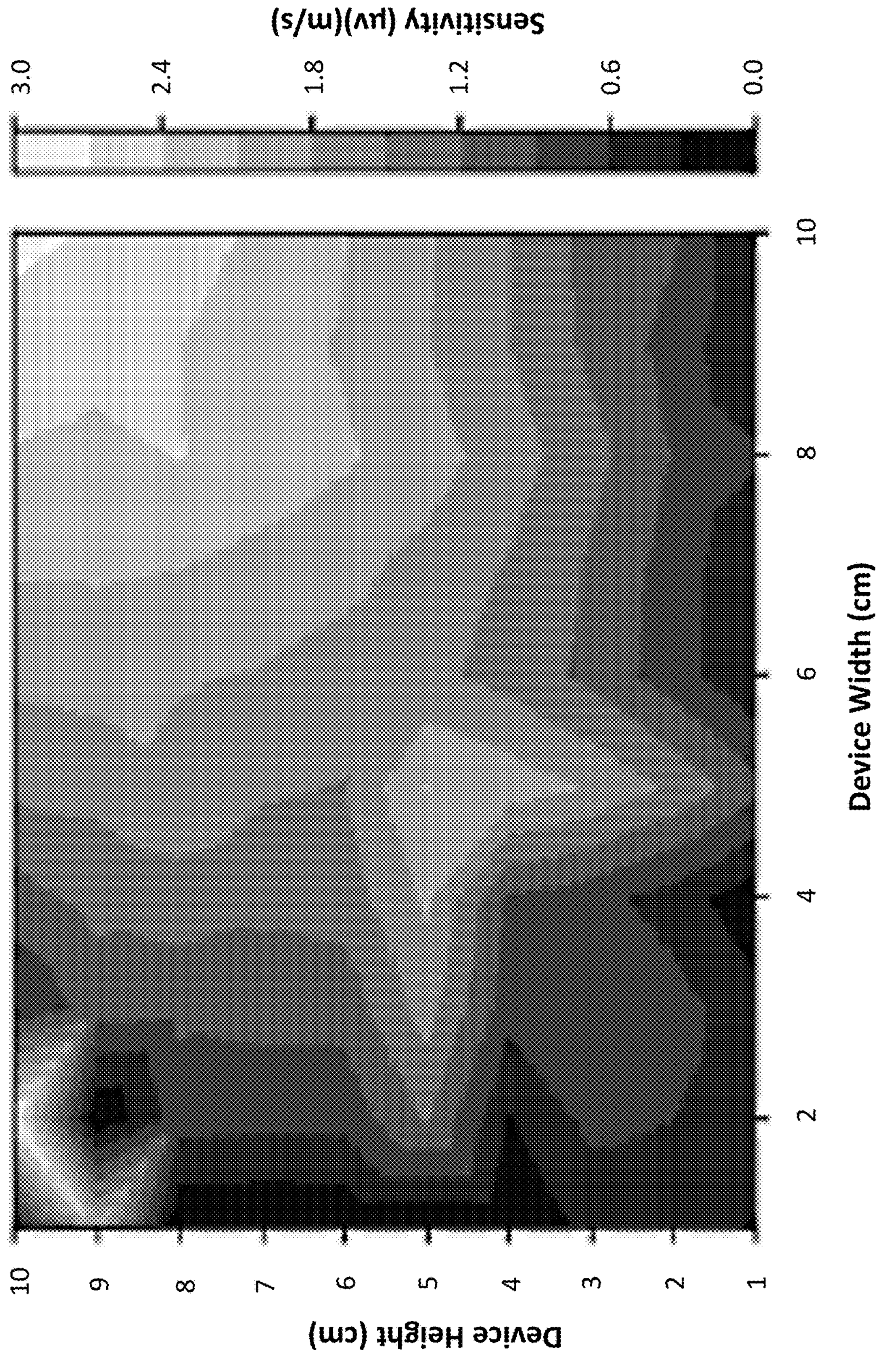
FIG. 10B is a simulation of the effect of aspect ratio on the raw sensing element signal.

FIG. 10B is a simulation of the effect of aspect ratio on the raw sensing element signal detected by loop 2. Like the simulations in FIG. 10A, increasing length improves sensitivity, as does increasing width, indicating that at any scale a square sensing element produces the best resolution. However, using a high aspect ratio sensing element increases isolation of loop 2 from adverse coupling.

Velocity gain is operable to be used to sustain velocity accuracy and precision resolution against loss of signal amplitude due to design and/or navigation tradeoffs. For example, at hypersonic velocities (e.g., MACH 15), the velocity gain is approximately 75 dBv, 25 dBv of which are operable to be sacrificed in reducing sensing element length from 10 cm to 5 mm (e.g., to fit in a missile nose). Flying within 2 degrees of parallel to the field lines reduces signal strength by 30 dBv. Taking account of such losses of signal strength indicates 20 dBv of gain remain that are operable to account for component non-idealities and/or to fly even closer to the field lines while maintaining at least the performance predicted by the simulations. In another example at MACH 15, the velocity gain is 75 dBv, 20 dBv of which are operable to offset loss of signals due to non-idealities of sensor components, leaving 55 dBv for tradeoffs (e.g., design and/or navigation tradeoffs).

In yet another example, an aircraft flying at 0.75 MACH (500 knots), generates a velocity gain of 48 dBv, 20 dBv of which are operable to be sacrificed in reducing sensing element length from 10 cm to 1 cm. Flying within 5 degrees of parallel to the field lines reduces gain by approximately 21 dBv, leaving 7 dBv to make up for non-idealities.

Table 2 lists an example of allocation of velocity gain for a plurality of velocities and velocity gains.

TABLE 2

| Velocity (MACH) | 2.3 | 15 | 0.48 |
| --- | --- | --- | --- |
| Velocity Gain Allocation | 58 dBv | 75 dBv | 37 dBv |
| Non-idealities | 10 dBv | 10 dBv | 10 dBv |
| Flight within 2 degrees | 30 dBv | 30 dBv | 2.5 degrees |
| Miniaturization | 18 dBv | 35 dBv | 0 dBv |
| Length | 1.26 cm | 1.8 mm | 10 cm |

After setting aside 10 dBv for non-idealities and assuming that a vehicle flies within 2 degrees of parallel to the field lines, the remaining velocity gain is used to calculate size of the sensing element support a drift rate of 8 m/day or 0.35 m/hr. A velocity of MACH 2.3 allows a 3-D array of 1.26 cm sensing elements. A velocity of MACH 15 allows a 3-D array of 1.8 mm sensing elements. A velocity of MACH 0.48 uses a 3-D array of 10 cm sensing elements and allows for flight within 2.5 degrees of the magnetic field lines. It will be appreciated that at least a portion of velocity gain is operable to be allocated for improving velocity resolution instead of reducing sensor size.

Figure 11:
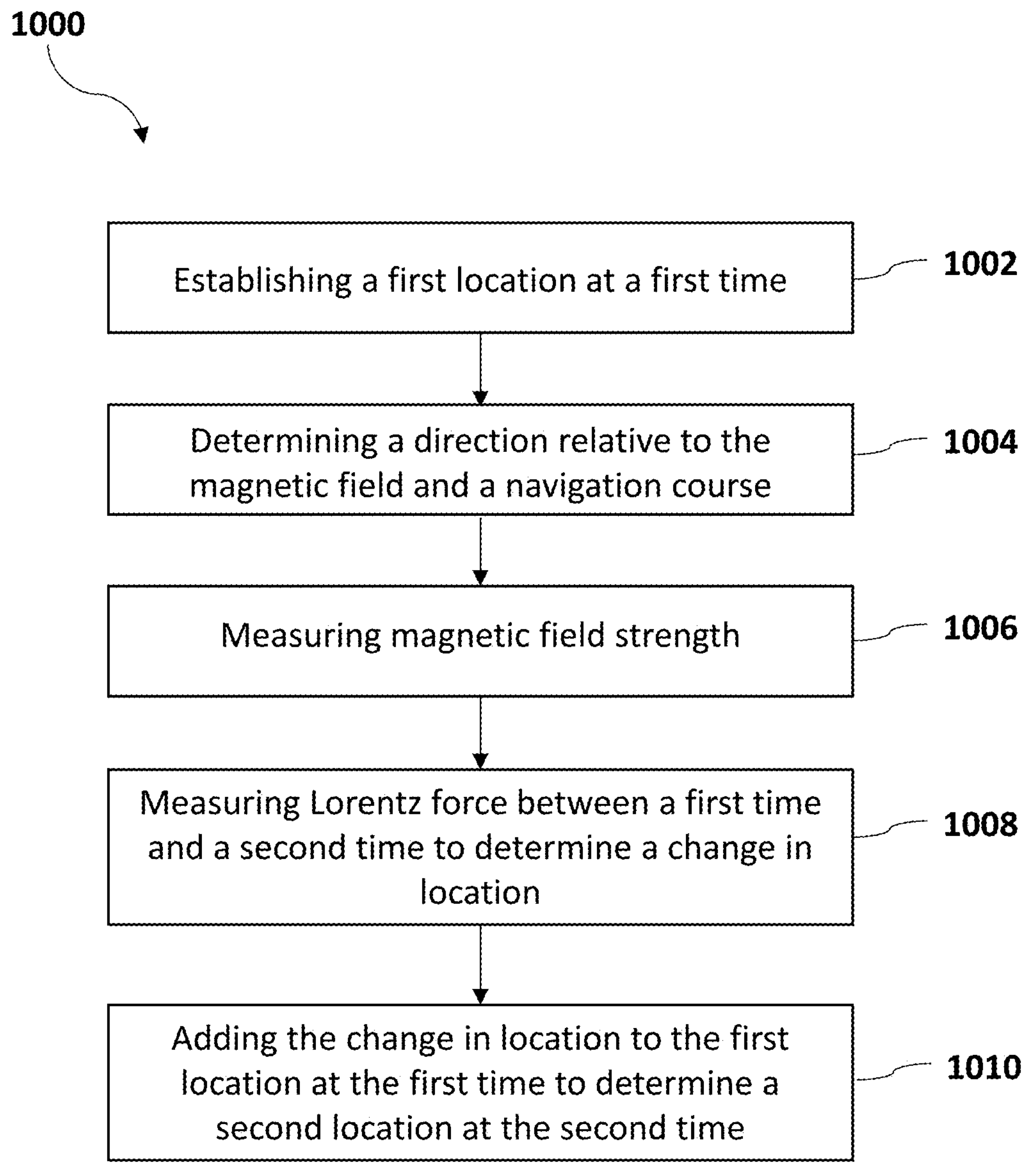
FIG. 11 illustrates one embodiment of a method of using an SLC.

In one embodiment, the present invention includes a method 1000 of using an SLC as shown in FIG. 11. In one embodiment, the method 1000 includes establishing a first location at a first time (e.g., departure) 1002, determining a direction relative to the magnetic field and a navigation course 1004, measuring magnetic field strength 1006, measuring Lorentz force between the first time and a second time to determine a change in location 1008, and adding the change in location to the first location at the first time to determine a second location at the second time 1010. Lorentz force is only generated by charges through a magnetic field, so an SLC at rest generates no Lorentz force.

As understood by one of ordinary skill in the art, more frequent update rates produce more accurate navigation, when field intensity varies appreciably during navigation. On the other hand, update rates can be relatively low in areas of known field uniformity and/or during constant navigation trajectory. Determinations of velocity and/or position are operable to be used to adjust trajectory (e.g., compensate for cross winds) or execute a change in trajectory according to a travel plan (e.g., flight plan).

Establishing the first location is conducted in two or three dimensions by any means including, but not limited to, input or triangulation (e.g., GPS, radio frequency (RF), or electro-optical/infrared (EO/IR) sensors), among other techniques.

In one embodiment, magnetic field strength is provided as an input or as a field prediction, for example, including changes in field strength as a function of distance along a desired flight path or trajectory. In one embodiment, field strength is adjusted for local field inclination and/or orientation of a navigation path relative to the magnetic field, to the direction of gravity, and/or to the horizon. In some cases, it is desirable to, from time to time, determine position with respect to the surface of the Earth (e.g., on a flight from RDU to LAX) in order to stay on course. In one embodiment, the attitude sensor is used translate velocity of an arbitrary trajectory of a vehicle into velocity over ground by a method known variously as projection or rotation, using the angle between the instantaneous trajectory of the vehicle and a horizontal direction. For example, the velocity over ground of a vehicle flying at 45 degrees with respect to direction of gravity, which itself is orthogonal to the horizontal, is determined as the product of velocity through the field and cosine of 45 degrees.

Figure 12:
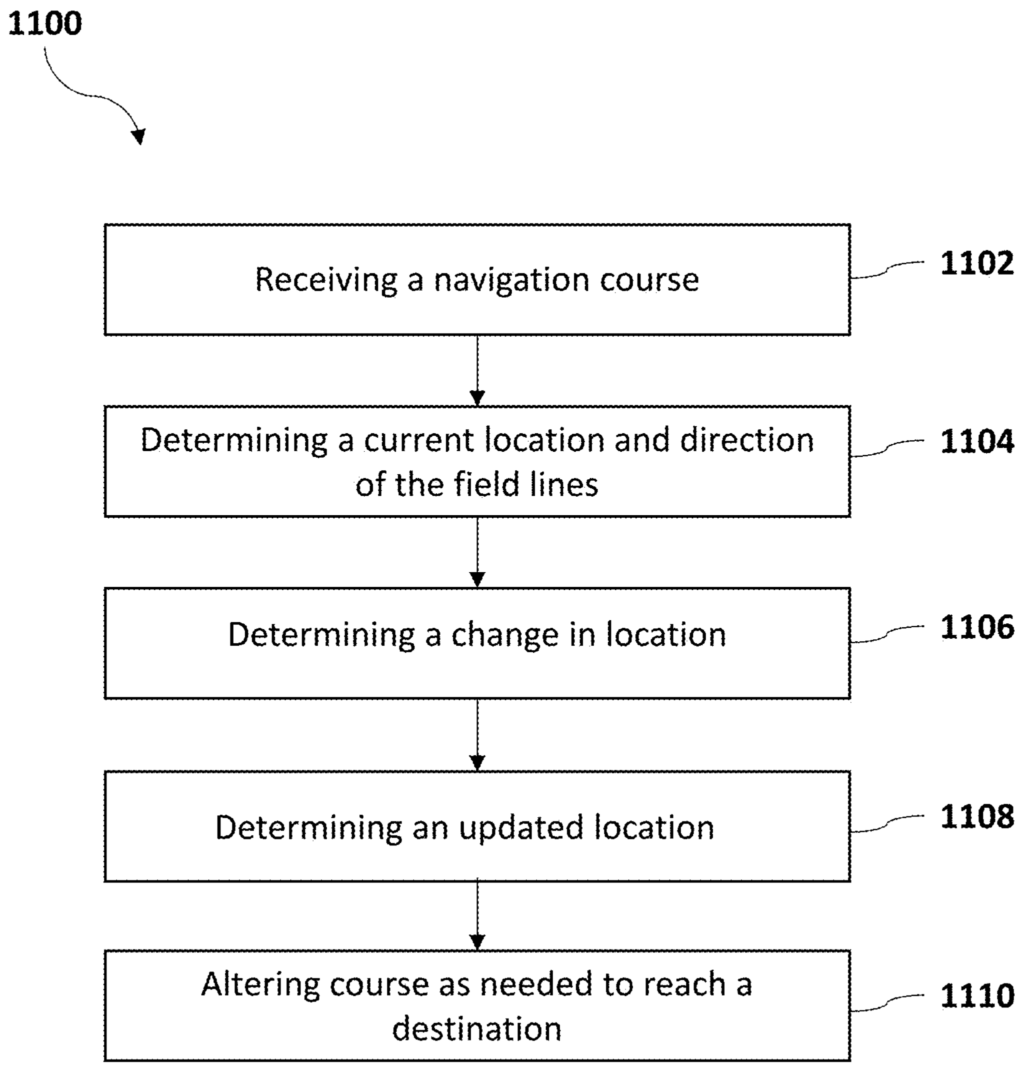
FIG. 12 illustrates one embodiment of a method of use of an SLC to determine a change in location of a vehicle as the vehicle navigates on a desired course.

An illustrative method 1100 of use of an SLC of the present invention is to determine a change in location of a vehicle as the vehicle navigates on a desired course as shown in FIG. 12. In one embodiment, the method 1100 includes receiving a navigation course 1102, determining a current location and direction of the field lines 1104, determining a change in location 1106, determining an updated location 1108, and altering course as needed to reach a destination 1110.

Figure 13:
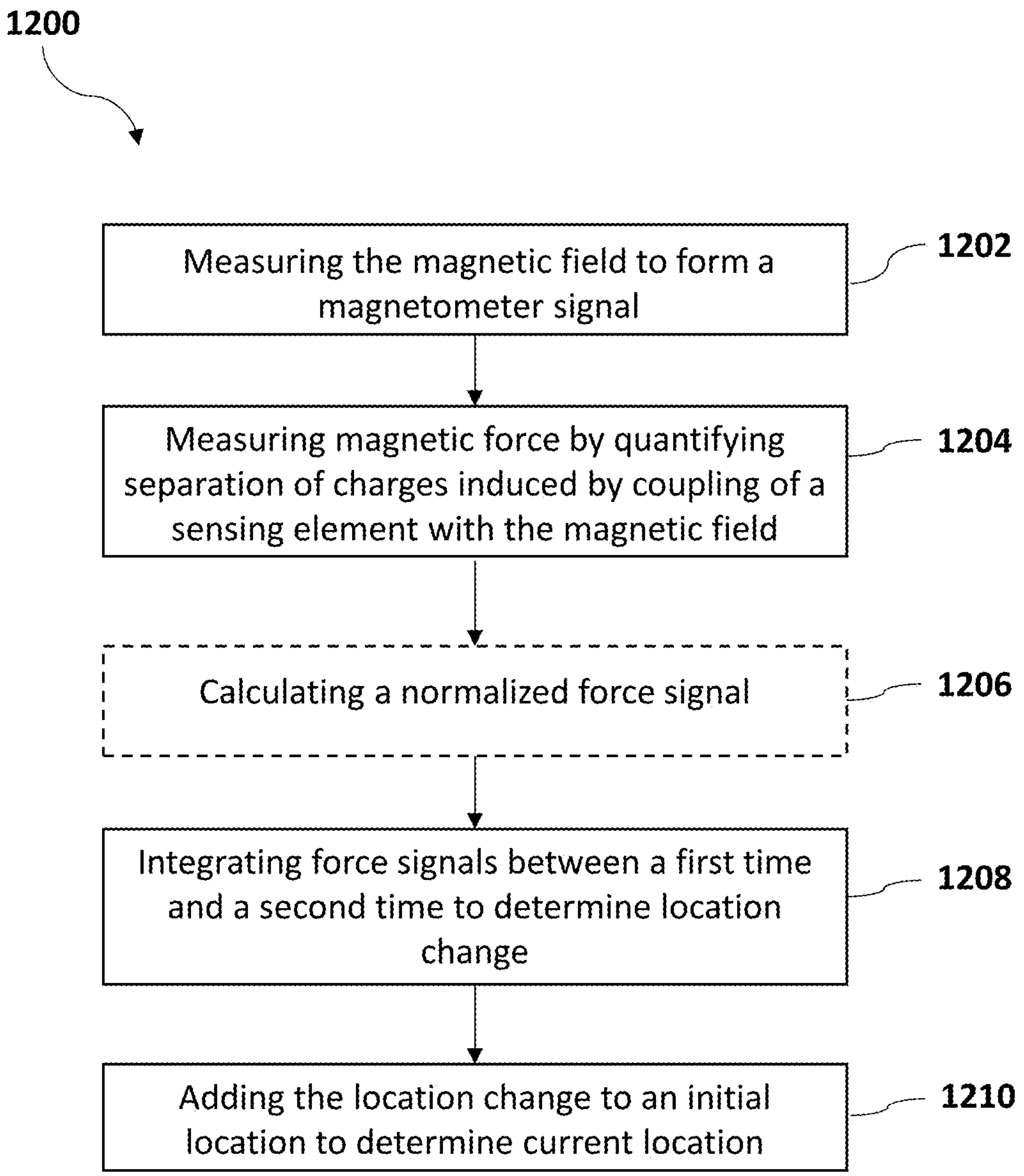
FIG. 13 illustrates one embodiment of a method of changing location.

In one embodiment, the present invention includes a method 1200 of changing location as shown in FIG. 13. The method 1200 includes measuring the magnetic field to form a magnetometer signal 1202, measuring magnetic force by quantifying separation of charges induced by coupling of a sensing element with the magnetic field 1204, optionally calculating a normalized force signal (e.g., the force signal divided by the magnetometer signal) 1206, integrating force signals (e.g., normalized force signals) between a first time and a second time to determine location change 1208, and adding the location change to an initial location to determine current location 1210. In one embodiment, the method includes converting change in location with respect to the field into a change in location with respect to a geographic location (e.g., a point of departure, destination). In one embodiment, the method includes providing output signals to an actuator or controller to adjust for departure from a desired navigation course.

Figure 14:
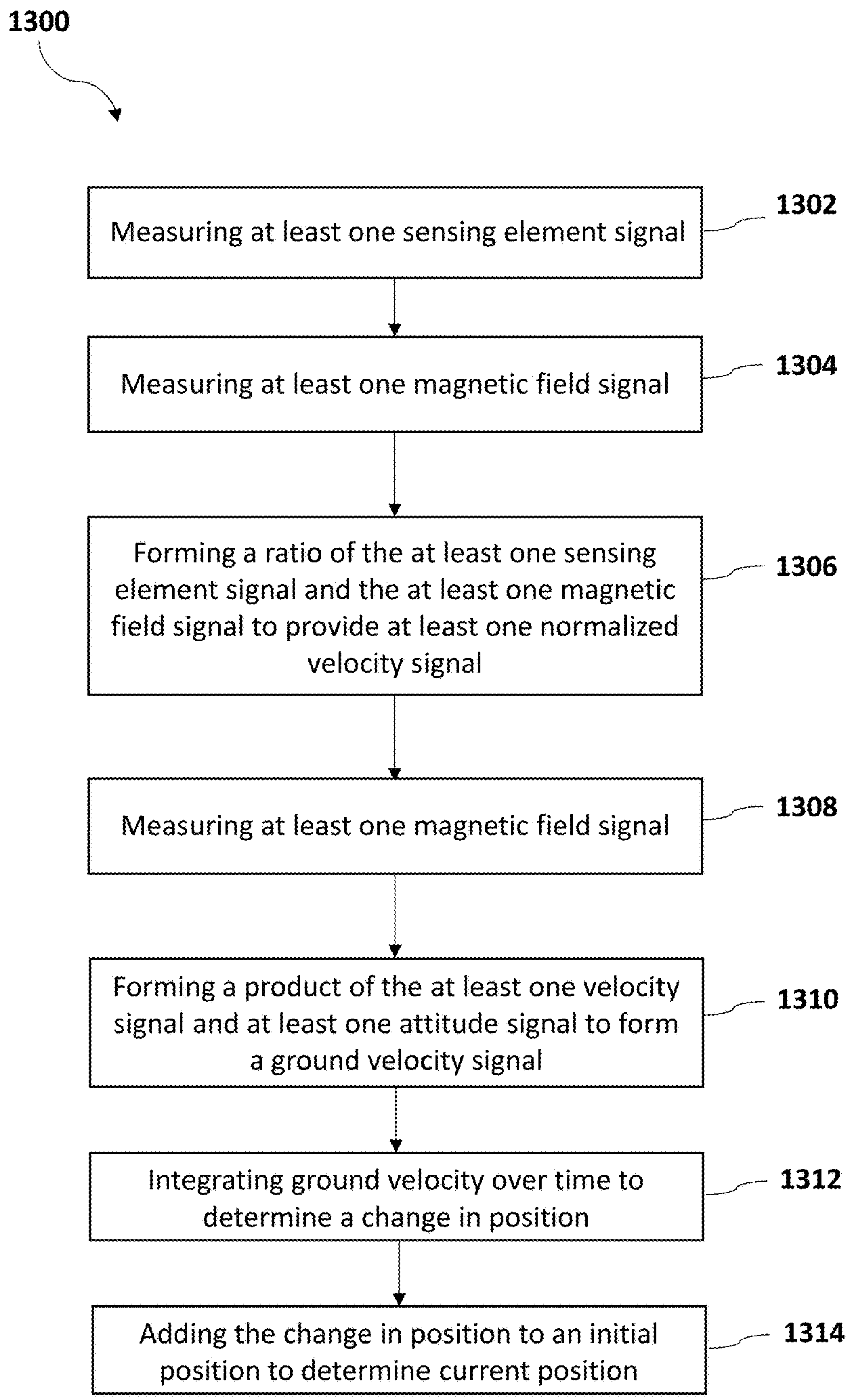
FIG. 14 illustrates one embodiment of a method of determining a position.

FIG. 14 illustrates one embodiment of a method 1300 of determining a position. In one embodiment, the method 1300 includes measuring at least one sensing element signal 1302, measuring at least one magnetic field signal 1304, forming a ratio of the at least one sensing element signal and the at least one magnetic field signal to provide at least one normalized velocity signal 1306, measuring at least one attitude signal 1308, forming a product of the at least one normalized velocity signal and at least one attitude signal to form a ground velocity signal 1310, integrating ground velocity over time to determine a change in position 1312, and adding the change in position to an initial position to determine current position 1314.

In one embodiment, the method further includes making a navigation adjustment or issuing an adjustment to improve position with respect to a desired position. One of ordinary skill in the art will appreciate that the enumerated steps are operable to be conducted sequentially or more or less simultaneously (e.g., by ensemble methods of fusing a plurality of signals). For example, but not limitation, measuring the at least one sensing element signal 1302 and measuring the at least one magnetic field signal 1304 are operable to be conducted simultaneously. One of ordinary skill in the art will also appreciate that a plurality of directional signal components are operable to be combined to form a vector signal. The attitude signal is operable to include a plurality of signal types including, but not limited to, gravity, translational acceleration, rotation rate, and other references, which are operable to be fused to provide an improved attitude signal. In some cases, predictive or other filtering of the attitude signal, or of its constituent signals, is conducted to reduce uncertainty of attitude signal used to convert velocity through the field into velocity over ground. In one embodiment, forming a ratio is conducted for signals of the same rank (e.g., scalar or vector), although rank matching is not required. In one embodiment, forming a ratio of vector signals preferably is conducted for each directional component of a first signal with the corresponding component of a second signal with the results then used to form a normalized ratio.

In one embodiment, measuring a signal includes improving a measured signal, for example, but not limitation, by using predictive or other type of filtering operable to reduce error of the filtered signal. In one embodiment, improving a measured signal is conducted using any method of reducing variability, including, but not limited to, averaging, filtering, predictive filtering, and other means. In one embodiment, predictive filtering includes Bayesian estimation (e.g., Kalman filtering). Kalman filtering is operable to include extended, unfiltered, non-linear, and other variants of Kalman filtering. In one embodiment, combining includes forming a new value (e.g., a quotient, a product) by arithmetic or fusion, among other methods. In one embodiment, filtering includes methods including, low pass filtering, band pass filtering, and/or high pass filtering. One of ordinary skill in the art will appreciate that integrating over time is a form averaging and/or filtering.

In one embodiment, normalizing includes predictive filtering of a series of normalized velocity signals by any means operable to reduce error of the normalized signal. In one embodiment, normalizing includes predictive filtering of a series of normalized velocity signals or velocity vectors. In one embodiment, forming a ground velocity signal includes predictive filtering of a series of ground velocity signals to form an improved ground velocity signal.

In one embodiment, the sensing unit signals and the magnetometer signals are normalized before forming the ratio E/B to minimize error in normalized velocity. In one embodiment, the ratio of normalized E/normalized B is then subjected to predictive filtering. In one embodiment, Kalman filtering (e.g., extended Kalman filtering) is performed on attitude signals or attitude signal components (e.g., acceleration, rotation, gravity) prior to use in converting MagV to VOG.

Figure 15:
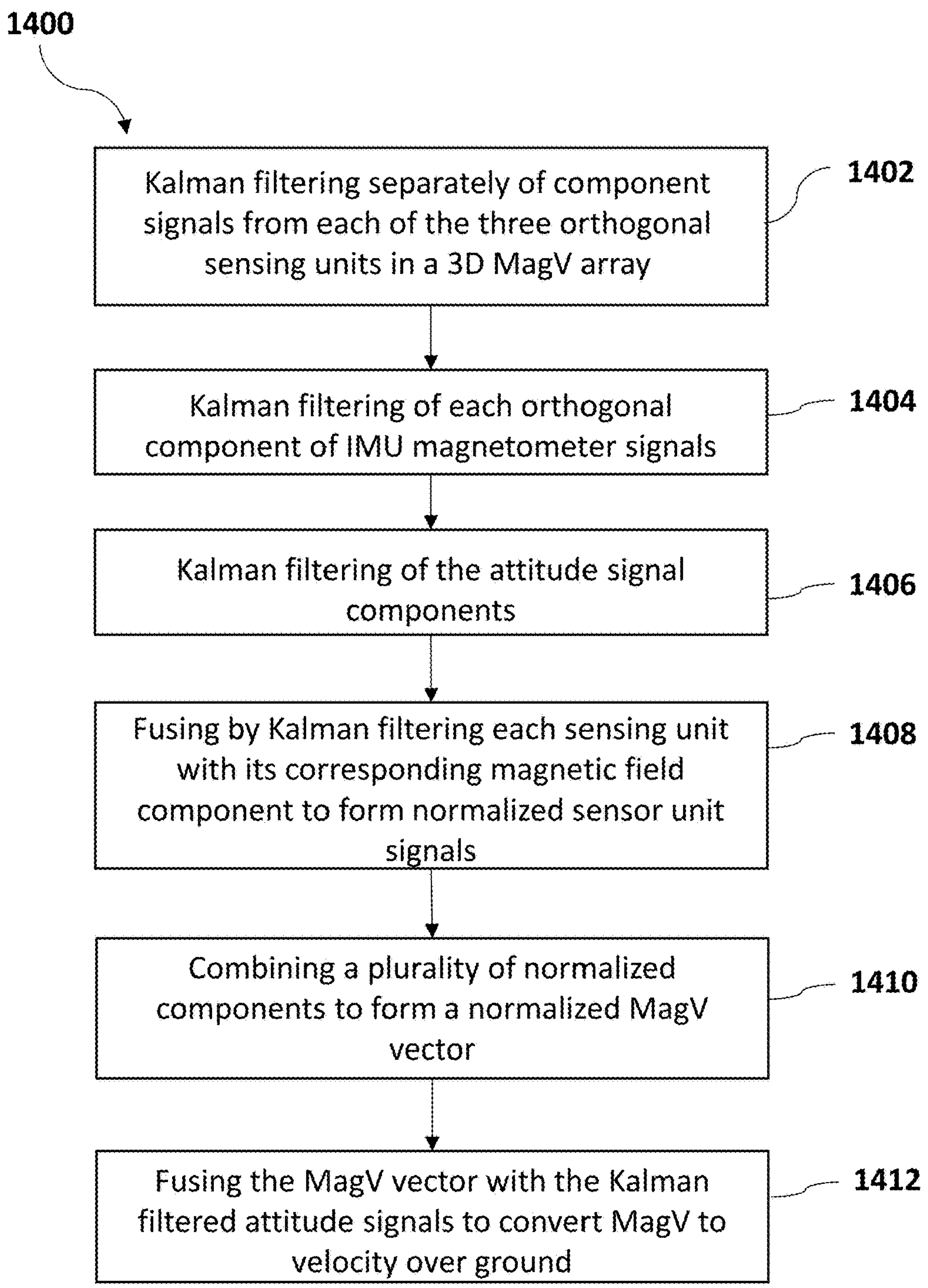
FIG. 15 illustrates one embodiment of a method including Kalman filtering.

FIG. 15 illustrates one embodiment of a method 1400 including Kalman filtering. In one embodiment, the method 1400 includes Kalman filtering separately of the component signals from each of the three orthogonal sensing units (SU) in a 3-D MagV array 1402, Kalman filtering of each orthogonal component of IMU magnetometer signals 1404, Kalman filtering of the attitude signal components 1406, fusing by Kalman filtering each SU signal with its corresponding magnetic field component to form normalized SU signals 1408, combining a plurality of normalized components to form a normalized MagV vector 1410, fusing the MagV vector with the Kalman filtered attitude signals to convert MagV to velocity over ground (VOG) 1412.

In one embodiment, attitude preferably is determined by Kalman filtering of IMU (e.g., linear acceleration, rotation, and gravity) signals. The resulting attitude vector is then fused with the normalized MagV vector to determine VOG. In one embodiment, given the sensitivity of normalized velocity signals (E/B) to errors in magnetic field signals, attitude signals are determined by joint-processing, or fusion, of signals from a plurality of IMU to provide an improved magnetic field signal and, thereby, an improved normalized velocity. It will be apparent to one of ordinary skill in the art that attitude signals, or components thereof, are operable to be fused by the same procedure to determine an improved attitude signal and, thereby, an improved velocity over ground signal.

Although described in terms of magnetic fields, the methods described above are operable to be practiced with respect to electric fields (e.g., from a power line), an RF signal (e.g., radar, an RF beacon), or an optical beacon.

In one embodiment, the SLC includes at least one processor, at least one memory, a direction finder (e.g., compass), at least one Lorentz force sensor, a magnetometer, and/or an I/O unit. In one embodiment, the at least one Lorentz force sensor includes a plurality of sensing units. In one embodiment, the magnetometer is a vector magnetometer. In one embodiment, the vector magnetometer is operable to determine field orientation and/or strength. Alternatively, the magnetometer is a scalar magnetometer. In one embodiment, the SLC further includes a Global Positioning System (GPS) device or is operable to communicate with a GPS device (e.g., via the I/O unit).

In another embodiment, the SLC includes at least one processor, at least one memory, a direction finder (e.g., compass), at least one Lorentz force sensor, an attitude sensor, a magnetometer, and/or an I/O unit. In one embodiment, the at least one Lorentz force sensor includes a plurality of sensing units. In one embodiment, the magnetometer is a vector magnetometer. In one embodiment, the vector magnetometer is operable to measure field orientation and/or strength. In one embodiment, the Lorentz force is normalized by dividing the initial force vector by the initial magnetic field vector. In one embodiment, the SLC further includes a Global Positioning System (GPS) device or is operable to communicate with a GPS device (e.g., via the I/O unit).

In yet another embodiment, the SLC includes at least one processor, at least one memory, a direction finder (e.g., e-compass), at least one Lorentz force sensor, an attitude sensor, an altitude sensor, a magnetometer, at least one inertial measurement unit (IMU), an inertial navigation system (INS), and/or an I/O unit. In one embodiment, the at least one Lorentz force sensor includes a plurality of sensing units. In one embodiment, the magnetometer is a vector magnetometer. In one embodiment, the vector magnetometer is operable to measure field orientation and/or strength. Advantageously, an SLC including the IMU and/or the INS is operable to provide more accurate velocity sensing during periods of high acceleration (e.g., during evasive maneuvers). In one embodiment, the SLC further includes a Global Positioning System (GPS) device or is operable to communicate with a GPS device (e.g., via the I/O unit). Additionally or alternatively, the SLC further includes at least one filter (e.g., low pass filter).

Figure 16:
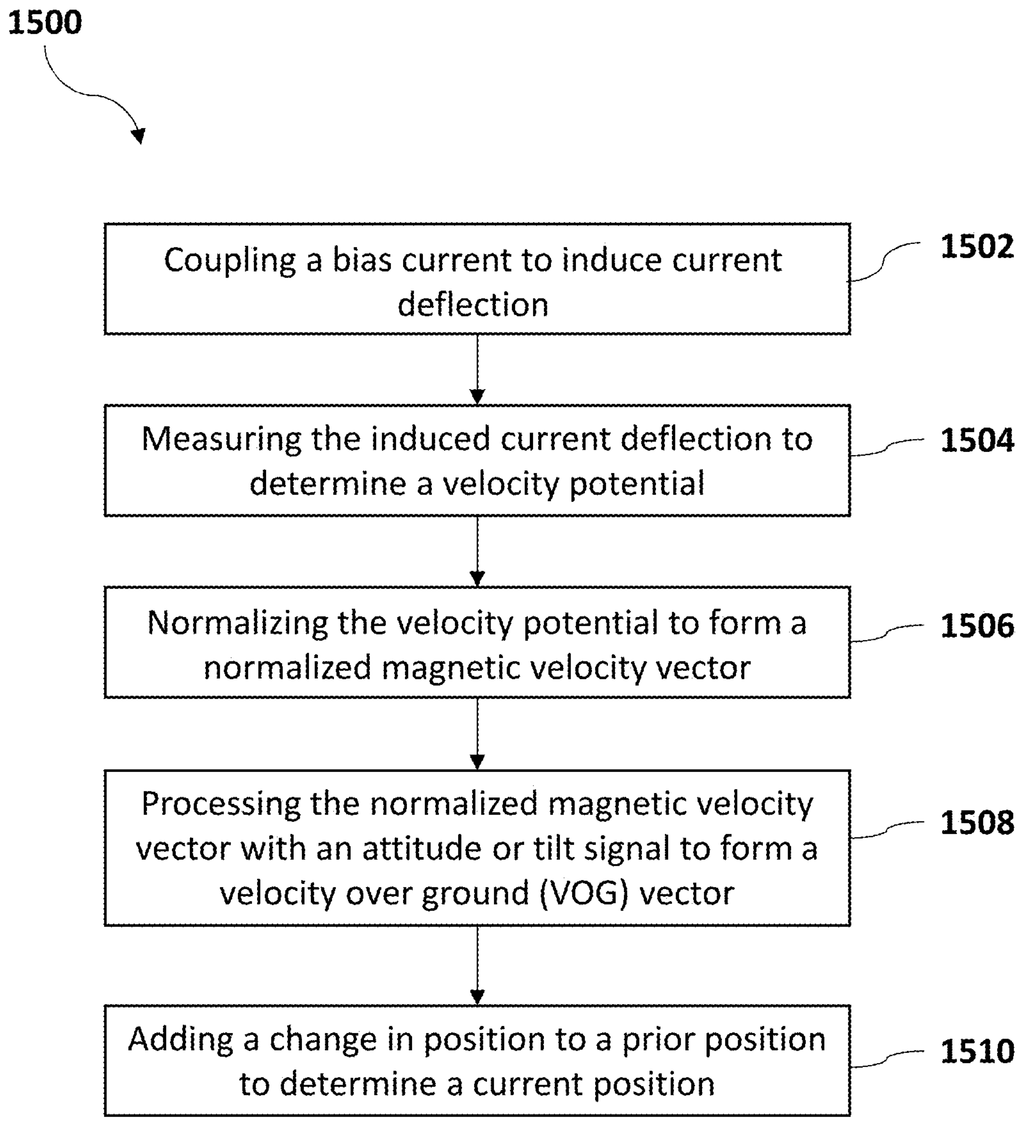
FIG. 16 illustrates one method of determining velocity over ground.

FIG. 16 illustrates one method of determining velocity over ground 1500. The method includes coupling a bias current to induce current deflection 1502, measuring the induced current deflection to determine a velocity potential 1504, normalizing the velocity potential to form a normalized magnetic velocity vector 1506, and processing the normalized magnetic velocity vector with an attitude or tilt signal to form a velocity over ground (VOG) vector 1508. In one embodiment, the normalized magnetic velocity vector is operable to be integrated over time to determine change in position with respect to the magnetic field. In one embodiment, the VOG vector is integrated over time to determine a change in geographic location or position. In one embodiment, the method further includes adding a change in position to a prior position to determine a current position 1510.

In one embodiment, coupling a bias current to induce current deflection 1502 includes measuring deflection using two second loops positioned across a sensing element including a midpoint positioned source type connection as described above. In one embodiment, signals from the first additional loop and the second additional loop are operable to be combined to form an enhanced velocity potential.

In one embodiment, the present invention provides a method for determining a velocity and/or a change in position including determining an orientation with respect to Earth's magnetic field lines using a direction finder, detecting a potential induced by coupling of the Earth's magnetic field with charges using a Lorentz force sensor, wherein the Lorentz force sensor includes at least one sensing unit, the Lorentz force sensor measuring the potential over a period of time, and determining the velocity and/or the change in position using at least one processor, wherein the at least one sensing unit includes at least one measurement circuit and at least one sensing element. In one embodiment, the method further includes the Lorenz force sensor detecting a Lorentz force in at least two dimensions. In one embodiment, the method further includes determining the orientation in at least two dimensions using the direction finder. In one embodiment, the method further includes determining magnetic field intensity using a magnetometer. In one embodiment, the method further includes quantifying orientation with respect to gravity, a horizontal plane, and/or a vertical plane using an attitude sensor. In one embodiment, the method further includes an input/output (I/O) unit receiving input data and/or outputting navigation or navigation control signals. In one embodiment, the method further includes detecting a direction relative to a radiofrequency (RF) source and/or an electro-optical source using the direction finder. In one embodiment, the method further includes determining magnetic field intensity in at least two dimensions, wherein the direction finder is a vector magnetometer. In one embodiment, the method further includes the Lorentz force sensor detecting a Lorentz force in at least two dimensions. In one embodiment, the method further includes the at least one processor is integrating the measured potential over the period of time and normalizing the integrated measured potential.

In another embodiment, the present invention provides a method for determining a velocity and/or a change in position including determining an orientation with respect to Earth's magnetic field lines using a direction finder, detecting a potential induced by coupling of the Earth's magnetic field with charges using a Lorentz force sensor, wherein the Lorentz force sensor includes at least one sensing unit, determining magnetic field intensity using a magnetometer, the Lorentz force sensor measuring the potential over a period of time, integrating the measured potential over the period of time using at least one processor, and normalizing the integrated measured potential to determine the velocity and/or the change in position using the at least one processor, wherein the at least one sensing unit includes at least one measurement circuit and at least one sensing element. In one embodiment, the method further includes determining magnetic field intensity using the magnetometer. In one embodiment, the method further includes the Lorenz force sensor detecting a Lorentz force in at least two dimensions. In one embodiment, the method further includes determining the orientation in at least two dimensions using the direction finder.

In yet another embodiment, the present invention provides a method for determining a velocity and/or a change in position including determining an orientation with respect to Earth's magnetic field lines using a direction finder, detecting a potential induced by coupling of the Earth's magnetic field with charges using a Lorentz force sensor, wherein the Lorentz force sensor includes at least one sensing unit, providing magnetometer and attitude signals using at least one inertial measurement unit (IMU) and/or at least one inertial navigation system (INS), the Lorentz force sensor measuring the potential over a period of time, integrating the measured potential over the period of time using at least one processor, normalizing the integrated measured potential to determine the velocity and/or the change in position using the at least one processor, wherein the at least one sensing unit includes at least one measurement circuit and at least one sensing element, and wherein the at least one measurement circuit is surrounded by a Faraday cage. In one embodiment, the method further includes fusing the magnetometer and attitude signals with the velocity to reset errors of the at least one IMU and/or the at least one INS. In one embodiment, the method further includes Kalman filtering the magnetometer and attitude signals, wherein the magnetometer and attitude signals are non-integrated magnetometer and attitude signals.

Use Cases

In one embodiment, the SLC is used on a vehicle. In one embodiment, the vehicle includes a drone, a car, a truck, a motorcycle, a scooter, a moped, a van, a recreational vehicle, a bus, a ground robot, a shuttle, a hypersonic vehicle, a hypersonic weapon, a reentry vehicle, an aircraft, a submersible, a submarine, a ship, a boat, a missile, a smart weapon, a helicopter, a glider, a steered air drop package, a precision air drop unit, an artillery shell, an electric vertical takeoff and landing vehicle (eVTOL), a jet, and/or a plane. In one embodiment, the vehicle is an autonomous or self-driving vehicle. A drone typically refers to a flying vehicle but is also operable to also include aquatic or ground vehicles (e.g., a toy boat or toy truck).

In one embodiment, the drone is a hobby drone. In one embodiment, a hobby drone includes any unlicensed fixed-wing or rotary-wing device operated by a person (e.g., a hobbyist). In one embodiment, the hobby drone includes an inertial navigation system. In one embodiment, the SLC uses a fixed value of field strength, assuming local field strength is essentially uniform. In one embodiment, the SLC includes a scalar drag force sensor. Advantageously, errors from the scalar drag force sensor are small in a straight-line flight.

In one embodiment, the vehicle is an autonomous vehicle. In one embodiment, the autonomous vehicle includes a car, a truck (e.g., long haul), a taxi, and/or a people mover. Advantageously, the present invention improves the accuracy and safety of navigation by autonomous vehicles, which use the vehicle as the frame of reference and rely on obstacle avoidance (OA) systems to prevent accidents. The inertial navigation systems (INS) used as a backup for GPS may cause autonomous vehicles to suffer explosive loss of position precision. Unless the OA system is operable to recognize and triangulate position with respect to local landmarks, the risk of accidents becomes substantial. For example, when an autonomous vehicle incorporating a tactical grade INS loses GPS reception and does not triangulate properly, the autonomous vehicle could drift out of the lane undetected in less than one second. By contrast, an SLC of the present invention is operable to keep the autonomous vehicle in the lane for minutes at a time without GPS and without need of data on nearby, reliably recognizable landmarks (e.g., using a map).

In one embodiment, the vehicle is a commercial autonomous vehicle. In one embodiment, the commercial autonomous vehicle includes a taxi, a shuttle, a bus, a delivery truck, a search and rescue vehicle, and/or a surveying air or aquatic vehicle. In one embodiment, the commercial autonomous vehicle does not include a driver. In one embodiment, the commercial autonomous vehicle provides last mile delivery.

In one embodiment, the vehicle is used in water. In one embodiment, the vehicle is a drone, a submersible, a submarine, a ship, and/or a boat. GPS signals are very quickly attenuated in water, disrupting reception by a submersible as soon as the submersible leaves the surface. An operator of a submersible may wish to avoid detection, choosing to navigate by dead reckoning using an INS rather than raise an antenna and risk detection. AN INS cannot detect steady currents, so a slow-moving submersible may quickly be blown off course with ocean and river currents often reaching 5 meters per second. By contrast, an SLC of the present invention measures velocity with respect to the Earth's field lines, which are fixed to the Earth, and determines location by integrating velocity through the magnetic field to determine change in position and adds it to a prior location. Advantageously, this is operable to be used while a vehicle is submerged, allowing a current location to be determined without risk of detection.

In one embodiment, the SLC is integrated with a weapons system. In one embodiment, the SLC is operable to provide navigation data to a vehicle (e.g., precision guided munition or cruise missile). The SLC is operable to provide information including, but not limited to, location, change in location, and/or velocity. In one embodiment, the SLC is operable to provide steering instructions (e.g., to an actuator or a rudder).

The SLC is operable to provide navigation in a plurality of settings including, but not limited to, a city and a rural area (e.g., the country). Cities generally have "recognizable" structures that are operable to be used to determine location (e.g., by triangulation and/or image recognition), such as those used by obstacle avoidance systems.

The present invention is operable to provide information for any vehicle that needs to reach a desired destination while staying on course to the desired destination.

Location data is created in the present invention using one or more hardware and/or software components. In one embodiment, the location data is compared to additional location data. By way of example, and not limitation, the additional location data is created using the Global Positioning System (GPS), low energy BLUETOOTH based systems such as beacons, wireless networks such as WIFI, Radio Frequency (RF) including RF Identification (RFID), Near Field Communication (NFC), magnetic positioning, and/or cellular triangulation. By way of example, the additional location data is determined via an Internet Protocol (IP) address of a device connected to a wireless network. A wireless router is also operable to determine identities of devices connected to the wireless network through the router, and thus is operable to determine the locations of these devices through their presence in the connection range of the wireless router to create the additional location data.

Location data created by the present invention is operable to be used to construct maps of the magnetic field or other data (e.g., signal source locations, features, or objects) that are operable to be used in subsequent navigation (e.g., on return from a destination, by another vehicle transiting the mapped area).

The system is operable to utilize a plurality of learning techniques including, but not limited to, machine learning (ML), artificial intelligence (AI), deep learning (DL), neural networks (NNs), artificial neural networks (ANNs), support vector machines (SVMs), Markov decision process (MDP), and/or natural language processing (NLP). The system is operable to use any of the aforementioned learning techniques alone or in combination.

Further, the system is operable to utilize predictive analytics techniques including, but not limited to, machine learning (ML), artificial intelligence (AI), neural networks (NNs) (e.g., long short term memory (LSTM) neural networks), deep learning, historical data, and/or data mining to make future predictions and/or models. The system is preferably operable to recommend and/or perform actions based on historical data, external data sources, ML, AI, NNs, and/or other learning techniques. The system is operable to utilize predictive modeling and/or optimization algorithms including, but not limited to, heuristic algorithms, particle swarm optimization, genetic algorithms, technical analysis descriptors, combinatorial algorithms, quantum optimization algorithms, iterative methods, deep learning techniques, and/or feature selection techniques.

Certain modifications and improvements will occur to those skilled in the art upon a reading of the foregoing description. The above-mentioned examples are provided to serve the purpose of clarifying the aspects of the invention and it will be apparent to one skilled in the art that they do not serve to limit the scope of the invention. All modifications and improvements have been deleted herein for the sake of conciseness and readability but are properly within the scope of the present invention.

The invention claimed is:

1. A device for measuring velocity comprising:

at least one sensing unit, wherein the at least one sensing unit comprises a first loop and a second loop; and an energy source operable to provide a bias current;

wherein the first loop comprises a sensing element connected to the energy source, wherein the sensing element is operable to carry the bias current;

wherein the second loop comprises a first conductor connected between a first side of the sensing element and a measurement circuit;

wherein the measurement circuit is further connected to a second conductor connected to a second side of the sensing element;

wherein the second loop is operable to determine a potential based on deflection of the bias current; and wherein a magnetic velocity is calculated based on the potential.

2. The device of claim 1, wherein the measurement circuit comprises a connection to an amplifier, wherein the amplifier is further connected to an analog-to-digital (A/D) converter, wherein the A/D converter is further connected to the output of the measurement circuit.

3. The device of claim 1, wherein the second loop is at least one of an optoelectronic type or an inductive type.

4. The device of claim 1, wherein the sensing element is formed from a material having a slow charge relaxation rate.

5. The device of claim 1, wherein the sensing element has a length to width ratio greater than 1:1.

6. The device of claim 1, wherein the first conductor and the second conductor are formed of a fast-relaxing material.

7. The device of claim 1, wherein the measurement circuit includes a temperature compensation unit.

8. The device of claim 1, wherein the sensing element comprises a source type connection to the energy source and sink type connections at the first end and the second end.

9. The device of claim 1, wherein the at least one sensing unit comprises a plurality of sensing units, wherein at least two sensing units of the plurality of sensing units are in a non-parallel arrangement.

10. A device for measuring velocity comprising:

at least one sensing unit, wherein the at least one sensing unit comprises a first loop and a second loop; and wherein the first loop comprises a sensing element operable to carry a bias current from an energy source;

wherein the second loop comprises a first conductor connected between the sensing element and a measurement circuit;

wherein the measurement circuit is further connected to a second conductor connected to the sensing element;

wherein the second loop is operable to determine a potential based on deflection of the bias current; and wherein the potential is used to calculate a velocity.

11. The device of claim 10, wherein the first conductor and the second conductor are formed of a fast-relaxing material.

12. The device of claim 10, wherein the measurement circuit comprises an input connected to an amplifier, wherein the amplifier is further connected to an analog-to-digital (A/D) converter, wherein the A/D converter is further connected to the output of the measurement circuit.

13. The device of claim 10, wherein the second loop is of an optoelectronic type.

14. The device of claim 10, wherein the sensing element is formed from a material having a slow charge relaxation rate.

15. A method of determining velocity comprising:

a power source providing a bias current in a sensing element of at least one sensing unit, wherein the at least one sensing unit comprises a first loop and a second loop;

detecting and measuring deflection of the bias current;

determining a potential based on the deflection; and calculating a velocity using the potential;

wherein the second loop comprises a first conductor connected between the sensing element and a measurement circuit; and wherein the measurement circuit is further connected to a second conductor connected to the sensing element.

16. The method of claim 15, wherein the measuring of the deflection comprises amplifying the potential to provide an amplified signal, converting the amplified signal to a digital signal, and providing the digital signal to a processor for processing to provide the calculated velocity.

17. The method of claim 15, further including adjusting an orientation of the sensing element with respect to the magnetic field to alter coupling to the magnetic field.

18. The method of claim 15, further including adjusting the bias current to provide desirable magnitude of the deflection.

19. The method of claim 15, further including converting the velocity to velocity-over-ground by normalizing the velocity for local field strength to form a normalized velocity and projecting the normalized velocity on a horizontal.

20. The method of claim 15, wherein the calculating of the velocity comprises temperature compensation.

* * * * *